US012701181B2

(12) United States Patent
Lee et al.

(10) Patent No.: US 12,701,181 B2
(45) Date of Patent: Aug. 4, 2026

(54) ELECTRONIC DEVICE INCLUDING WATERPROOF STRUCTURE

(71) Applicant: Samsung Electronics Co., Ltd., Suwon-si (KR)

(72) Inventors: Yongseok Lee, Suwon-si (KR); Sangmin Kim, Suwon-si (KR); Daeyoung Noh, Suwon-si (KR); Heecheul Moon, Suwon-si (KR); Sangyoup Seok, Suwon-si (KR); Kwonho Son, Suwon-si (KR); Minchang Shim, Suwon-si (KR); Minwoo Yoo, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 662 days.

(21) Appl. No.: 18/561,907

(22) PCT Filed: Sep. 29, 2021

(86) PCT No.: PCT/KR2021/013330
§ 371 (c)(1),
(2) Date: Nov. 17, 2023

(87) PCT Pub. No.: WO2022/071747
PCT Pub. Date: Apr. 7, 2022

(65) Prior Publication Data
US 2024/0205322 A1 Jun. 20, 2024

(30) Foreign Application Priority Data
Sep. 29, 2020 (KR) ........................ 10-2020-0127332

(51) Int. Cl.
H04M 1/00 (2006.01)
H04M 1/02 (2006.01)
(Continued)

(52) U.S. Cl.
CPC ........... H04M 1/18 (2013.01); H04M 1/0264 (2013.01); H05K 5/03 (2013.01)

(58) Field of Classification Search
CPC .... H04M 1/18; H04M 1/0264; H04M 1/0202; H04M 1/0266; H05K 5/03; H05K 5/062; H05K 5/0086
See application file for complete search history.

(56) References Cited

U.S. PATENT DOCUMENTS 8,738,097 B2 5/2014 Hong
8,861,198 B1 * 10/2014 Asuncion .............. G06F 1/1658
361/679.55
(Continued)

FOREIGN PATENT DOCUMENTS

CN 101753654 A 6/2010
JP 2009302313 A 12/2009
(Continued)

OTHER PUBLICATIONS

Indian Office Action Issued In IN Application No. 202347023089, Mail Date Oct. 10, 2023, 6.
(Continued)

*Primary Examiner* — Md K Talukder
(74) *Attorney, Agent, or Firm* — CANTOR COLBURN LLP

(57) ABSTRACT

According to one embodiment of the present invention, an electronic device may include: a cover part, which forms an outer surface of the electronic device, and which includes a first cover member including a portion of an edge of the outer surface, and a second cover member including a second portion of the edge; a support member positioned inside the electronic device; and a first adhesive member, which includes a first adhesive part having a closed curve shape positioned between the cover part and the support member along the edge, and a second adhesive part extend-
(Continued)

ing from the first adhesive part and covering a boundary part along the boundary part between the first cover member and the second cover member. Other various embodiments are possible.

18 Claims, 11 Drawing Sheets

(51) Int. Cl.
   *H04M 1/18*          (2006.01)
   *H05K 5/03*          (2006.01)

(56)                 References Cited

U.S. PATENT DOCUMENTS

| | | | | |
|---|---|---|---|---|
| 9,042,095 | B2 | 5/2015 | Song et al. | |
| 10,257,333 | B2 | 4/2019 | Kim et al. | |
| 10,674,572 | B2 | 6/2020 | Cho et al. | |
| 10,839,194 | B2 | 11/2020 | Jung et al. | |
| 2010/0134963 | A1* | 6/2010 | Suzuki | H04M 1/18 |
| | | | | 361/679.01 |
| 2012/0063077 | A1 | 3/2012 | Tomobe et al. | |
| 2016/0156755 | A1* | 6/2016 | Choi | G06F 1/1658 |
| | | | | 455/575.1 |
| 2016/0205230 | A1 | 7/2016 | Hisano et al. | |
| 2016/0234362 | A1 | 8/2016 | Moon et al. | |
| 2017/0135239 | A1* | 5/2017 | Hyun | G06F 1/1656 |
| 2018/0241861 | A1 | 8/2018 | Kim et al. | |
| 2019/0059164 | A1* | 2/2019 | Hassemer | H05K 1/0306 |
| 2019/0082083 | A1* | 3/2019 | Jarvis | G06F 1/1684 |
| 2019/0129236 | A1* | 5/2019 | Kim | H04M 1/0249 |
| 2019/0254129 | A1 | 8/2019 | Cho et al. | |
| 2019/0296259 | A1* | 9/2019 | Baek | H10K 59/40 |

| | | | | |
|---|---|---|---|---|
| 2020/0099414 | A1 | 3/2020 | Herman | |
| 2020/0220954 | A1* | 7/2020 | Hebert | H04M 1/0266 |
| 2020/0358890 | A1* | 11/2020 | Im | H04M 1/0202 |
| 2021/0286407 | A1* | 9/2021 | Kim | G06F 1/1616 |
| 2024/0205322 | A1* | 6/2024 | Lee | H05K 5/03 |

FOREIGN PATENT DOCUMENTS

| | | | |
|---|---|---|---|
| JP | 2010130582 | A | 6/2010 |
| JP | 2010273213 | A | 12/2010 |
| JP | 2013179355 | A | 9/2013 |
| JP | 5576339 | B2 | 8/2014 |
| KR | 100640721 | B1 | 11/2006 |
| KR | 20090082847 | A | 7/2009 |
| KR | 101370837 | B1 | 3/2014 |
| KR | 101395358 | B1 | 5/2014 |
| KR | 20180026191 | A | 3/2018 |
| KR | 20180096178 | A | 8/2018 |
| KR | 102078371 | B1 | 2/2020 |
| KR | 20200100294 | A | 8/2020 |

OTHER PUBLICATIONS

European Search Report Issued In EP Application No. 21876022. 1-1224, Mail Dated Feb. 1, 2024, 10 Pages.

International Search Report with Written Opinion for International Application No. PCT/KR2021/013330; International Filing Date Sep. 29, 2021; Date of Mailing Jan. 11, 2022 (13 pages).

Indian Office Action Issued In IN Application No. 202347023089, Mail Date Sep. 12, 2024, 4 Pages.

Korean Office Action Issued In KR Application No. 10-2020-0127332; Mail Date Sep. 19, 2024; 19 Pages.

Chinese Office Action Issued In CN Patent Application No. 202180067057.1, Issue Date Sep. 3, 2025, 13 Pages.

* cited by examiner

ELECTRONIC DEVICE INCLUDING WATERPROOF STRUCTURE

CROSS-REFERENCE TO RELATED APPLICATION(S)

This application is the 371 application of PCT Application No. PCT/KR2021/013330, filed on Sep. 29, 2021, which is based on and claims the benefit of Korean patent application number 10-2020-0127332, filed on Sep. 29, 2020, in the Korean Intellectual Property Office, the disclosures of which are incorporated by reference herein in their entireties.

TECHNICAL FIELD

The disclosure relates to an electronic device including a waterproof structure.

BACKGROUND ART

Electronic devices, such as smartphones, have gradually become slimmer while becoming reinforced in certain design aspects. Electronic devices have thus been developed to have differentiated functions to satisfy different consumers' purchase needs. For example, some electronic devices may have a waterproof function.

DISCLOSURE OF INVENTION

Technical Problem

The housing of an electronic device may include a plurality of housing parts that form an outward appearance of the electronic device. The electronic device may include waterproof members which prevent an alien substance, such as water, from entering the inside of the electronic device through the plurality of housing parts. However, spatial efficiency may be reduced due to the waterproof members.

Various embodiments of the disclosure may provide an electronic device including a waterproof structure, which can improve spatial efficiency.

Solution to Problem

According to embodiments of the disclosure, an electronic device may include a cover part forming an outer surface of the electronic device, the cover part including a first cover member including a part of an edge of the outer surface and a second cover member including a second part of the edge, a support member disposed within the electronic device, and a first adhesive member including a first adhesive part having a closed loop form and being disposed between the cover part and the support member along the edge and a second adhesive part extended from the first adhesive part and covering a boundary part between the first cover member and the second cover member along the boundary part.

Advantageous Effects of Invention

The electronic device including a waterproof structure according to various embodiments of the disclosure can improve spatial efficiency or arrangement efficiency relating to the adhesive member while securing a waterproof function.

In addition, effects which may be obtained or predicted due to various embodiments of the disclosure are directly or implicitly disclosed in the detailed description according to embodiments of the disclosure. For example, various effects predicted according to various embodiments of the disclosure will be disclosed in the detailed description to be given later.

MODE FOR THE INVENTION

Figure 1:
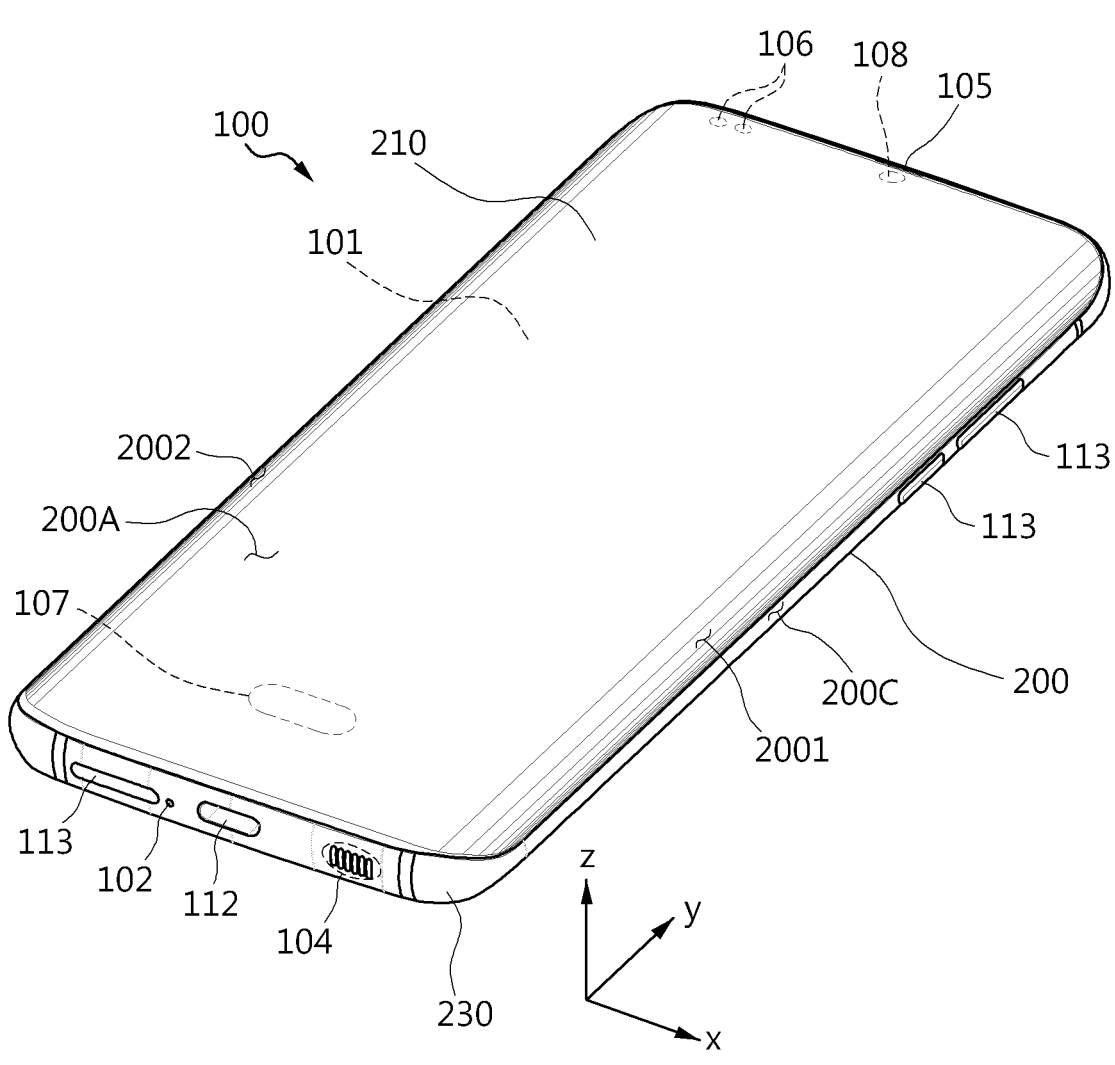
FIG. 1 is a perspective view of a front surface of a mobile electronic device according to an embodiment.

Hereinafter, various embodiments of this document are described with reference to the accompanying drawings.

Various embodiments of this document and terms used in the embodiments are not intended to limit the technical characteristics, described in this document, to specific embodiments, and should be understood as including various changes, equivalents or alternatives of a corresponding embodiment. In relation to the description of the drawings, similar reference numerals may be used for similar or related elements. A singular form of a noun corresponding to an item may include one item or a plurality of items unless explicitly described otherwise in the context. In this document, each of phrases, such as "A or B", "at least one of A and B", "at least one of A or B", "A, B or C", "at least one of A, B and C", and "at least one of A, B, or C", may include any one of items listed along with a corresponding one of the phrases or all possible combinations of the listed items. Terms, such as "a first", "a second", or "the first" or "the second", may be used to merely distinguish between a corresponding element and another corresponding element, and do not limit corresponding elements in another aspect (e.g., importance or a sequence).

The electronic device according to various embodiments disclosed in this document may be various types of devices. The electronic device may include a portable communication device (e.g., a smartphone), a computer device, a portable multimedia device, a portable medical device, a camera, a wearable device, or home appliances, for example. The electronic device according to various embodiments of this document is not limited to the aforementioned device.

Figure 2:
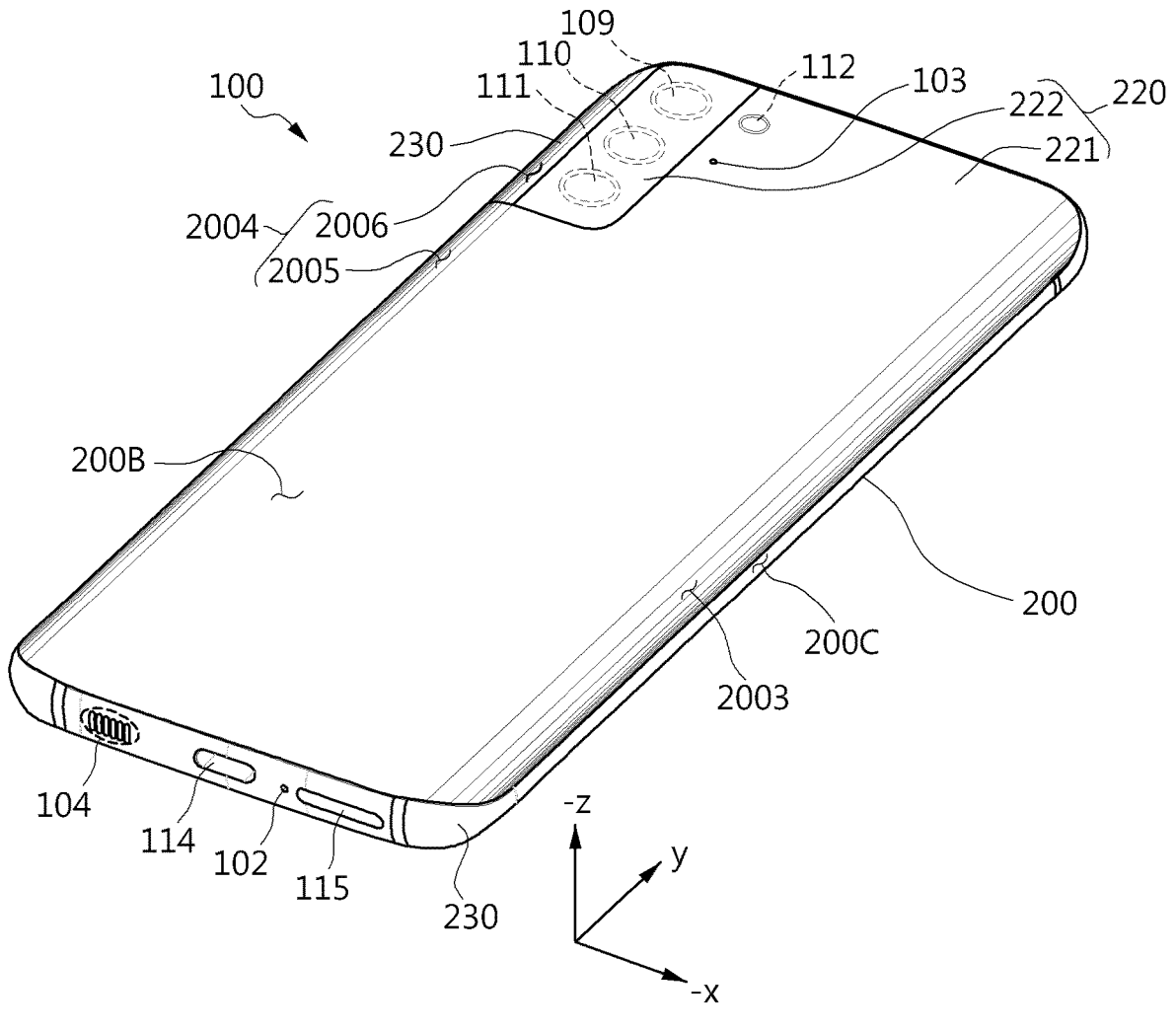
FIG. 2 is a perspective view of a rear surface of the electronic device of FIG. 1 according to an embodiment.

FIG. 1 is a perspective view of a front surface of a mobile electronic device 100 according to an embodiment. FIG. 2 is a perspective view of a rear surface of the electronic device 100 of FIG. 1 according to an embodiment.

With reference to FIGS. 1 and 2, in an embodiment, the electronic device 100 may include a housing 200, including a first surface (or a front surface) 200A toward a first direction (e.g., a +z axis direction), a second surface (or a rear surface) 200B toward a second direction (e.g., a –z axis direction) opposite to the first direction, and a side surface 200C that surrounds a space between the first surface 200A and the second surface 200B. According to another embodiment, the housing 200 may denote a structure that forms at least some of the first surface 200A, the second surface 200B, and the side surface 200C.

According to an embodiment, the housing 200 may include a first area 2001 and a second area 2002 that are bent from the first surface 200A toward the second surface 200B and seamlessly extended. In various embodiments, the first area 2001 and the second area 2002 may be symmetrical to each other with the first surface 200A (e.g., a first plane part) interposed therebetween. The housing 200 may include a third area 2003 and a fourth area 2004 that are bent from the second surface 200B toward the first surface 200A and seamlessly extended. The third area 2003 may be disposed on a side opposite to the first area 2001 in accordance with the first area 2001. The fourth area 2004 may be disposed on a side opposite to the second area 2002 in accordance with the second area 2002. In various embodiments, the third area 2003 and the fourth area 2004 may be symmetrical to each other with the second surface 200B (e.g., a second plane part) interposed therebetween. The first area 2001, the second area 2002, the third area 2003, and the fourth area 2004 may be included in the side surface 200C of the housing 200. According to an embodiment, the first area 2001 and the second area 2002 may be included in the first surface 200A, and the third area 2003 and the fourth area 2004 may be included in the second surface 200B. In another embodiment (not illustrated), the housing 200 may be implemented without at least one of the first area 2001, the second area 2002, the third area 2003, and the fourth area 2004. For example, the first surface 200A (e.g., the first plane part) may be extended by substituting at least one of the first area 2001 and the second area 2002. For example, the second surface 200B (e.g., the second plane part) may be extended by substituting at least one of the third area 2003 and the fourth area 2004.

According to an embodiment, the housing 200 may include a first housing part 210, a second housing part 220, and/or a third housing part 230. The first housing part 210 may be disposed on a side opposite to the second housing part 220. The third housing part 230 (e.g., a bezel structure) may surround a space between the first housing part 210 and the second housing part 220.

The first housing part 210 (e.g., a first plate or a first cover part) may form the first surface 200A, the first area 2001, and the second area 2002, for example. The first housing part 210 may include a glass plate or a polymer plate which includes various coating layers. The first area 2001 may be formed to be adjacent to a long edge of the first housing part 210 on one side thereof. The second area 2002 may be formed to be adjacent to a long edge of the first housing part 210 on the other side thereof.

The second housing part 220 (e.g., the second cover part) may form the second surface 200B, the third area 2003, and the fourth area 2004, for example. According to an embodiment, the second housing part 220 may include a first cover member 221 (e.g., a second plate) and a second cover member 222 (e.g., a third plate). The first cover member 221 and/or the second cover member 222 may be formed by coating or colored glass, ceramic, a polymer, metal, or a combination of at least two of the materials, for example. According to an embodiment, the first cover member 221 and/or the second cover member 222 may include aluminum, an aluminum alloy, magnesium, a magnesium alloy, or an alloy (e.g., stainless steel) including iron.

The second surface 200B may be formed by the first cover member 221 and the second cover member 222. The third area 2003 may be formed by the first cover member 221. The third area 2003 may be formed to be adjacent to an edge of the first cover member 221 on one side thereof in accordance with the first area 2001. The fourth area 2004 may include a fifth area 2005 that is formed by the first cover member 221. The fifth area 2005 may be formed to be adjacent to an edge of the first cover member 221 on the other side thereof in accordance with a part of the second area 2002. The fourth area 2004 may include a sixth area 2006 that is formed by the third housing part 230 in accordance with a part of the second area 2002. An outer surface by the fifth area 2005 and an outer surface by the sixth area 2006 may be smoothly connected. According to an embodiment, the sixth area 2006 may be formed by the first cover member 221 or second cover member 222 of the second housing part 220.

The third housing part 230 may be coupled with the first housing part 210 and the second housing part 220, for example, and may include metal and/or a polymer. In an embodiment, the first cover member 221 or second cover member 222 of the second housing part 220 may be formed integrally with the third housing part 230, and may include the same material (e.g., a metal material such as aluminum) as the third housing part 230.

According to an embodiment, the electronic device 100 may include one or more of a display 101, audio modules 102, 103, 104, and 105, sensor modules 106 and 107, camera modules 108, 109, 110, and 111, a flash 112, key input devices 113, and connector modules 114 and 115. In an embodiment, at least one (e.g., the key input devices 113) of the components may be omitted from the electronic device 100 or the electronic device 100 may additionally include another component (e.g., a fingerprint sensor or a light-emission element). The term "module" used in this document may include a unit implemented as hardware, software or firmware, and may be interchangeably used with a term, such as logic, a logical block, a part, or a circuit. The module may be an integrated part or a minimum unit of the part in which one or more functions are performed or a part thereof.

The display 101 may be visually exposed through a major portion of the first housing part 210, for example. In an embodiment, a corner of the display 101 may be formed generally identically with a neighbor outskirt shape of the first housing part 210. In another embodiment (not illustrated), to extend the area in which the display 101 is exposed, an interval between the outskirt of the display 101 and the outskirt of the first housing part 102 may be generally identically formed. A touch sensing circuit, a pressure sensor capable of measuring the intensity (pressure) of a touch, and/or a digitizer that detects a stylus pen having a magnetic method may be coupled with or included in the display 101, or may be disposed to be adjacent to the display 101.

The audio modules 102, 103, 104, and 105 may include audio modules 102 and 103 related to a microphone and audio modules 104 and 105 related to a speaker, for example. The first audio module 102 may include a first microphone disposed within the electronic device 100, and a first microphone hole formed in the side surface 200C (or the third housing part 230) of the housing 200 in accordance with the first microphone. The second audio module 103 may include a second microphone disposed within the electronic device 100, and a second microphone hole formed in the second surface 200B (or the first cover member 221 of the second housing part 220) of the housing 200 in accordance with the second microphone. The third audio module 104 may include a first speaker disposed within the electronic device 100, and a first speaker hole formed in the side surface 200C (or the third housing part 230) of the housing 200 in accordance with the first speaker. The fourth audio module 105 may include a second speaker (e.g., a receiver for a call) disposed within the electronic device 100, and a second speaker hole (e.g., a receiver hole for a call) formed in the first surface 200A (or the first housing part 210) of the housing 200 in accordance with the second speaker. According to various embodiments, the electronic device 100 may detect the direction of a sound by using a plurality of microphones. According to an embodiment, at least one speaker hole and at least one microphone hole may be implemented as one hole. According to an embodiment, the speaker may be implemented without a speaker hole like a piezo speaker.

The sensor modules 106 and 107 may generate an electrical signal or a data value corresponding to an internal operating state of the electronic device 100 or an external environment state. The first sensor module 106 may include a proximity sensor that generates a signal relating to the proximity of an external object based on light that passes through some area of the first surface 200A of the housing 200 and/or an illuminance sensor for detecting external illuminance, for example. The second sensor module 107 may include a fingerprint sensor for detecting information relating to a fingerprint based on light that passes through some area of the first surface 200A, for example. Furthermore, for example, the second sensor module 107 may include an ultrasonic fingerprint sensor using ultrasonic waves. Although not illustrated, the sensor module may be disposed in accordance with the second surface 200B of the housing 200. The electronic device 100 may include at least one of sensor modules not illustrated, for example, a gesture sensor, a gyro sensor, a barometric sensor, a magnetic sensor, an acceleration sensor, a grip sensor, a color sensor, an infrared (IR) sensor, a bio sensor (e.g., an HRM sensor), a temperature sensor, a humidity sensor, or an illuminance sensor.

The camera modules 108, 109, 110, and 111 may include a first camera module 108 and/or second camera modules 109, 110, and 111, for example. The first camera module 108 may generate an image signal based on external light that is received through the first surface 200A of the housing 200. The second camera modules 109, 110, and 111 may generate an image signal based on external light that is received through the second surface 200B of the housing 200. According to an embodiment, the second cover member 222 of the second housing part 220 may be disposed in accordance with the second camera modules 109, 110, and 111. The second cover member 222 may include transparent areas that have been aligned with the second camera modules 109, 110, and 111. The second camera modules 109, 110, and 111 may generate an image signal based on external light that is received through the transparent areas. An area except the transparent areas aligned with the second camera modules 109, 110, and 111 in the second cover member 222 may be opaquely formed. The flash 112 may include a light source, such as a light-emitting diode or a xenon lamp. According to an embodiment, the first cover member 221 of the second housing part 220 may include a transparent area that has been aligned with the flash 112. Light output by the flash 112 may be emitted to the outside through the transparent area of the first cover member 221. An area except the transparent area aligned with the flash 112 in the first cover member 221 may be opaquely formed. According to an embodiment, the transparent area aligned with the flash 112 may be substituted with an opening. The first camera module 108 and/or the second camera modules 109, 110, and 111 may include one or a plurality of lenses, an image sensor, and/or an image signal processor, for example. The second camera modules 109, 110, and 111 may include an infrared camera module 109, a wide-angle camera module 110, or a telescope camera module 111, for example.

The key input devices 113 may be disposed in the side surface 200C (or the third housing part 230) of the housing 200. In another embodiment, the electronic device 100 may not include some or all of the key input devices 113. A key input device that has not been included in the electronic device 100 may be implemented in another form, such as a soft key, on the display 101. According to an embodiment, the key input device may include a sensor module.

The electronic device 100 may further include a light-emission element (not illustrated). The light-emission element may be disposed to be adjacent to the first surface 200A, for example, within the electronic device 100. According to an embodiment, the light-emission element may provide information relating to the state of the electronic device 100 (e.g., various types of state information, such as the amount of remaining battery power, the state in which the electronic device has been connected to an external electronic device such as a charging device, or the reception of a message) in a light form. According to another embodiment, the light-emission element may provide a light source that operates in conjunction with an operation of the first camera module 108. The light-emission element may include an LED, an IR LED, or a xenon lamp, for example.

The connector modules 114 and 115 may include a first connector module 114 for connecting an external electronic device and a second connector module 115 for connecting external memory. The electronic device 100 may transmit and/or receive power and/or data to and/or from the external electronic device connected to the first connector module 114. The first connector module 114 may include an external connector (e.g., a USB connector) disposed within the electronic device 100 and a first connector hole formed in the side surface 200C (or the third housing part 230) of the housing 200 in accordance with the external connector. The second connector module 115 may include a memory connector (or a memory socket) disposed within the electronic device 100 and a second connector hole formed in the side surface 200C (or the third housing part 230) of the housing 200 in accordance with the memory connector. The second connector hole may be covered by the cover.

In various embodiments, at least one electronic part (e.g., the first camera module 108, the first sensor module 106, and/or the second sensor module 107) may be disposed at the bottom of at least a part of a screen (e.g., a screen display area or an active area) of the display 101. For example, the at least one electronic part may be disposed in the rear surface of the screen or below or beneath the screen. According to an embodiment, the at least one electronic part may be aligned with a recess formed in the rear surface of the display 101, and may be disposed within the electronic device 100. A location of the at least one electronic part is not visually distinguished (or exposed). The at least one electronic part may perform a related function. For example, when viewed over the screen (e.g., when viewed in the −z axis direction), the first camera module 108 may be disposed to overlap at least a part of the screen, and may obtain an image of an external subject without being disposed to the outside. For example, when viewed over the screen, the first sensor module 106 and/or the second sensor module 107 may be disposed to overlap at least a part of the screen, and may perform a corresponding sensing function without being exposed to the outside. Some area of the display 101, which at least partially overlaps the at least one electronic part, may include a different pixel structure and/or wiring structure compared to another area of the display 101. For example, some area of the display 101, which at least partially overlaps the at least one electronic part, may have a pixel density different from that of another area of the display 101. The pixel structure and/or wiring structure that is formed in some area of the display 101, which at least partially overlaps the at least one electronic part, can reduce a loss of various forms of signals (e.g., light or ultrasonic waves) related to the at least one electronic part when the various forms of signals pass through between the outside and the at least one electronic part. According to an embodiment, a plurality of pixels may not be disposed in some area of the display 101, which at least partially overlaps the at least one electronic part. According to another embodiment, the at least one electronic part may be aligned with an opening (e.g., a through hole or a notch) formed in the display 101, and may be disposed within the electronic device 100.

Figure 3:
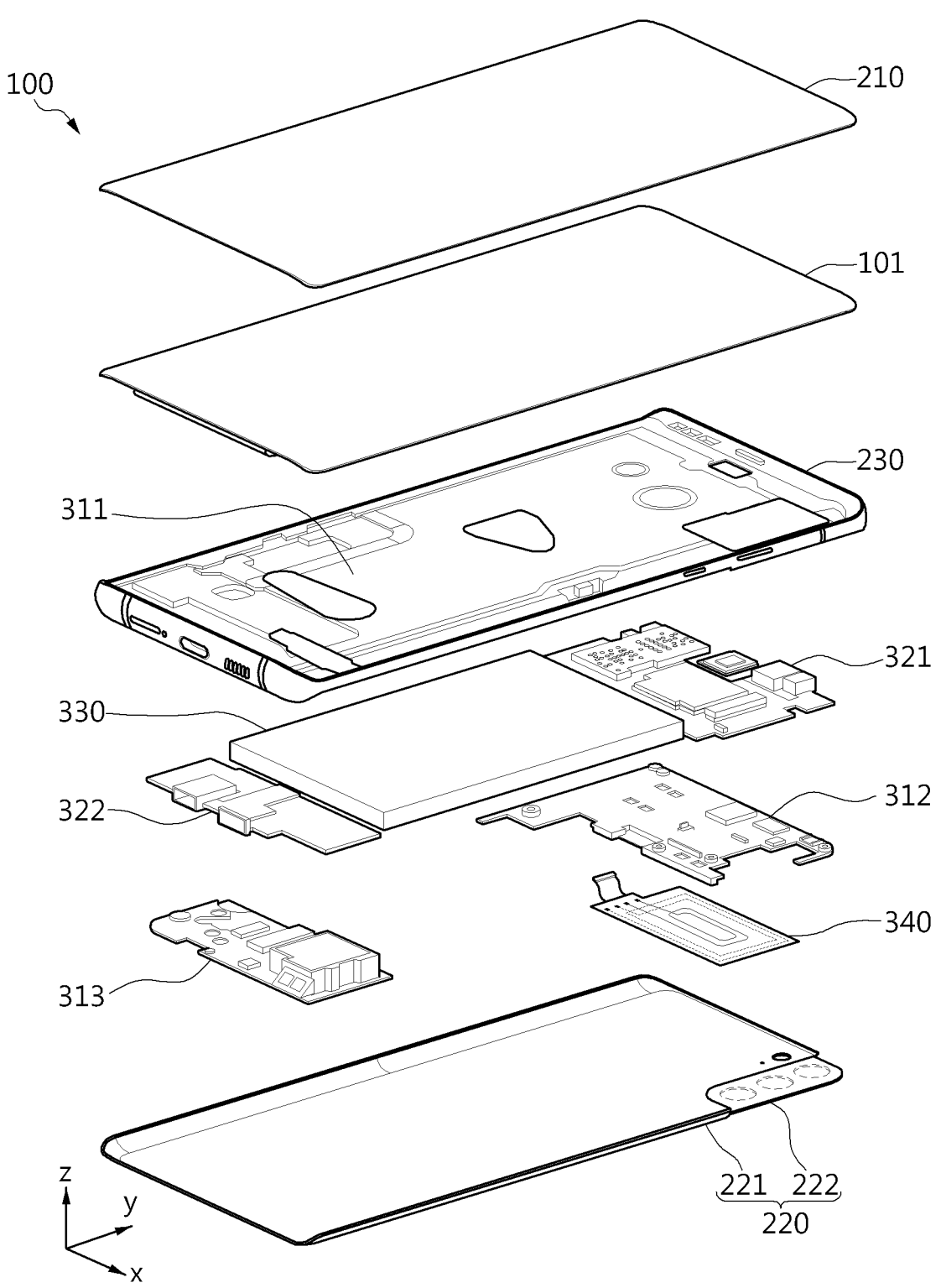
FIG. 3 is an exploded perspective view relating to the electronic device of FIG. 1 according to an embodiment.

FIG. 3 is an exploded perspective view relating to the electronic device 100 of FIG. 1 according to an embodiment.

With reference to FIG. 3, in an embodiment, the electronic device 100 may include the first housing part 210, the second housing part 220, the third housing part 230, a first support member 311, a second support member 312, a third support member 313, the display 101, a first substrate assembly 321, a second substrate assembly 322, a battery 330, or an antenna structure 340. In an embodiment, the electronic device 100 may omit at least one (e.g., the second support member 312 or the third support member 313) of the components or may additionally include another component.

The first support member 311 (e.g., a first bracket) may be disposed within the electronic device 100, for example, and may be connected to the third housing part 230 (e.g., the bezel structure) or may be formed integrally with the third housing part 230. The first support member 311 may be formed of a metal material and/or a nonmetal material (e.g., a polymer), for example.

The display 101 may be disposed between the first support member 311 and the first housing part 210, for example, and may be coupled with an outer surface of the first support member 311. The first substrate assembly 321 and the second substrate assembly 322 may be disposed between the first support member 311 and the second housing part 220, for example, and may be coupled with the other surface of the first support member 311. The battery 330 may be disposed between the first support member 311 and the second housing part 220, for example, and may be disposed in the first support member 311.

According to an embodiment, the first substrate assembly 321 may include a first printed circuit board (PCB) (not illustrated). The first substrate assembly 321 may include various electronic parts that are electrically connected to the first PCB. The electronic parts may be disposed in the first PCB or may be electrically connected to the first PCB through an electrical path, such as a cable or a flexible printed circuit board (FPCB). With reference to FIGS. 1 and 2, the electronic parts may include a microphone included in the second audio module 103, a speaker included in the fourth audio module 105, the first sensor module 106, the first camera module 108, the second camera modules 109, 110, and 111, the third camera module 112, and the key input devices 113, for example. According to various embodiments, the first substrate assembly 321 may include a primary PCB (or a main PCB or a master PCB), a secondary PCB (or slave PCB) that is disposed to overlap a part of the primary PCB, and/or an interposer substrate between the primary PCB and the secondary PCB.

According to an embodiment, when viewed over the first housing part 210, the second substrate assembly 322 may be spaced apart from the first substrate assembly 321 with the battery 330 interposed therebetween. The second substrate assembly 332 may include a second PCB that is electrically connected to the first PCB of the first substrate assembly 321. The second substrate assembly 332 may include various electronic parts that are electrically connected to the second PCB. The electronic part may be disposed in the second PCB or may be electrically connected to the second PCB through an electrical path, such as a cable or an FPCB. With reference to FIGS. 1 and 2, the electronic parts may include a microphone included in the first audio module 102, a speaker included in the third audio module 104, a connector included in the first connector module 114, and/or a connector included in the second connector module 115, for example.

The battery 330 is a device for supplying power to at least one component of the electronic device 100, and may include a primary cell incapable of being recharged, a secondary cell capable of being recharged, or a fuel cell, for example. The battery 330 may be integrally disposed within the electronic device 100, and may be disposed in a way to be detachable from the electronic device 100.

According to an embodiment, the second support member 312 (e.g., the second bracket) may be disposed between the first support member 311 and the second housing part 220, and may be coupled with the first support member 311 by using a screw or another fastening structure. At least a part of the first substrate assembly 321 may be disposed between the first support member 311 and the second support member 312. The second support member 312 can protect the first substrate assembly 321 by covering the first substrate assembly 321. When viewed over the second housing part 220 (e.g., when viewed in the z axis direction), the third support member 313 (e.g., the third bracket) may be spaced apart from the second support member 312 with the battery 330 interposed therebetween. The third support member 313 may be disposed between the first support member 311 and the second housing part 220, and may be coupled with the first support member 311 by using a screw or another fastening structure. At least a part of the second substrate assembly 322 may be disposed between the first support member 311 and the third support member 313. The third support member 313 can protect the second substrate assembly 322 by covering the second substrate assembly 322. The second support member 312 and/or the third support member 313 may be formed of a metal material and/or a nonmetal material (e.g., a polymer). According to an embodiment, the second support member 312 and/or the third support member 313 may be denoted as a rear case.

According to an embodiment (not illustrated), a whole substrate assembly including the first substrate assembly 321 and the second substrate assembly 322 may be implemented.

For example, when viewed over the second housing part 220 (e.g., when viewed in the z axis direction), the substrate assembly may include a first part and a second part that are disposed to be spaced apart from each other with the battery 330 interposed therebetween and a third part that extends between the battery 330 and the third housing part 230 and that connects the first part and the second part. In this case, a whole support member including the second support member 312 and the third support member 313 may be implemented.

According to an embodiment, the antenna structure 340 may be disposed between the second support member 312 and the second housing part 220. In an embodiment, the antenna structure 340 may be disposed between the battery 330 and the second housing part 220. In various embodiments, the antenna structure 340 may be disposed between the second support member 312, the third support member 313, the battery 330, and the second housing part 220. The antenna structure 340 may be implemented in the form of a film, such as an FPCB, for example. The antenna structure 340 may include at least one conductive pattern which is used as a loop type radiator. For example, the at least one conductive pattern may include a spiral conductive pattern (e.g., a plane coil or a pattern coil) having a plane form. According to an embodiment, the conductive pattern of the antenna structure 340 may be electrically connected to a wireless communication circuit (or a wireless communication module) disposed in the first substrate assembly 321. For example, the conductive pattern may be used in short-distance wireless communication, such as near field communication (NFC). As another example, the conductive pattern may be used in magnetic secure transmission (MST) that transmits and/or receives a magnetic signal. According to various embodiments, the conductive pattern of the antenna structure 340 may be electrically connected to a power transmission and reception circuit disposed in the first substrate assembly 321. The power transmission and reception circuit may wirelessly receive power from an external electronic device or wirelessly transmit power to the external electronic device through the conductive pattern. The power transmission and reception circuit may include a power management module, and may include a power management integrated circuit (PMIC), or a charger integrated circuit (IC), for example. The power transmission and reception circuit may charge the battery 250 by using power that has been wirelessly received through the conductive pattern.

According to various embodiments (not illustrated), the electronic device 100 may further include various components depending on a provision form thereof. All of such components may not be enumerated because the components are variously modified according to the convergence trend of the electronic device 100, but a component having a level equivalent to the levels of the aforementioned components may be additionally further included in the electronic device 100. According to various embodiments, specific components may be excluded from the components or may be substituted with other components depending on a provision form of the electronic device 100.

Figure 4:
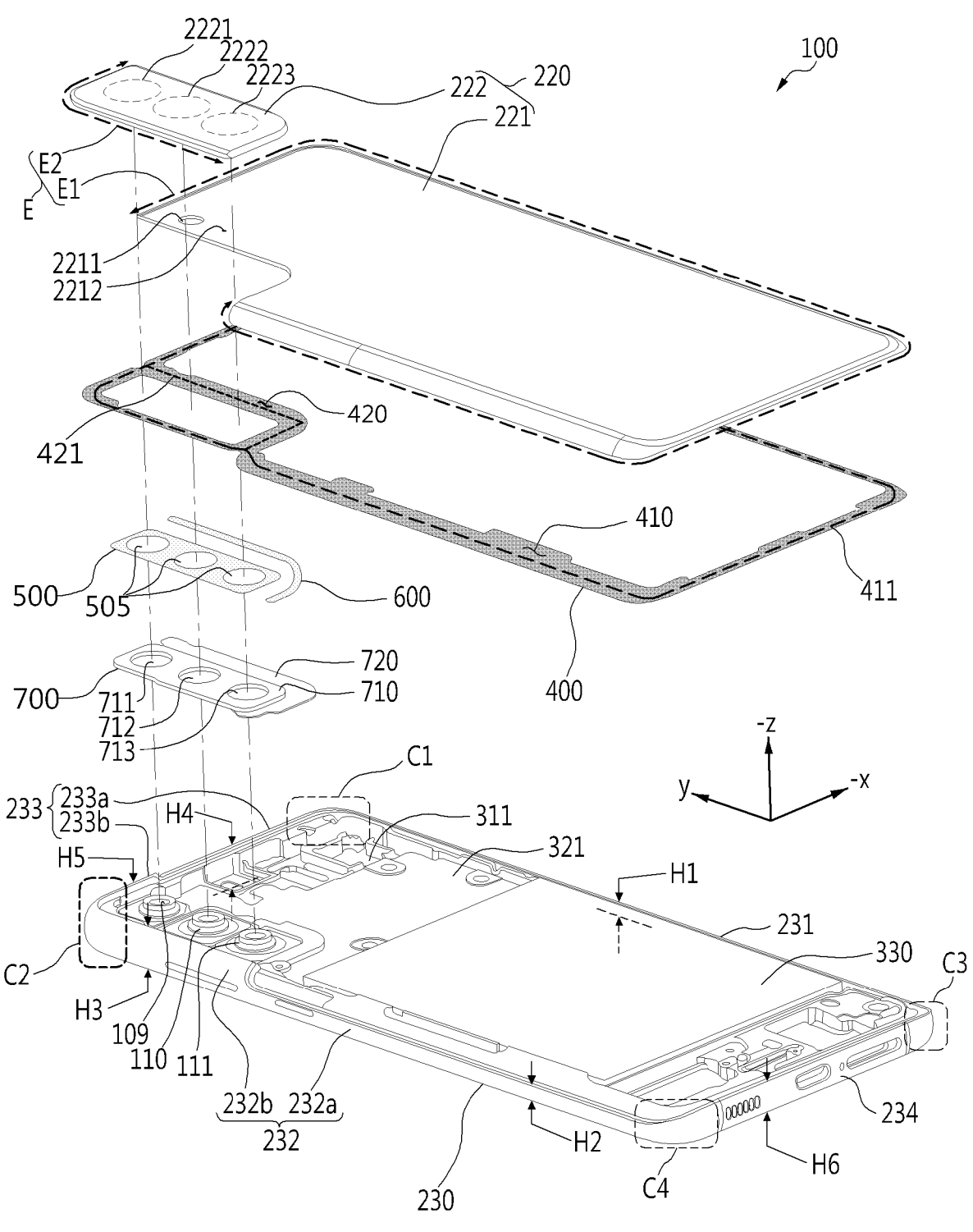
FIG. 4 is an exploded perspective view relating to the electronic device of FIG. 1 according to an embodiment.
Figure 5:
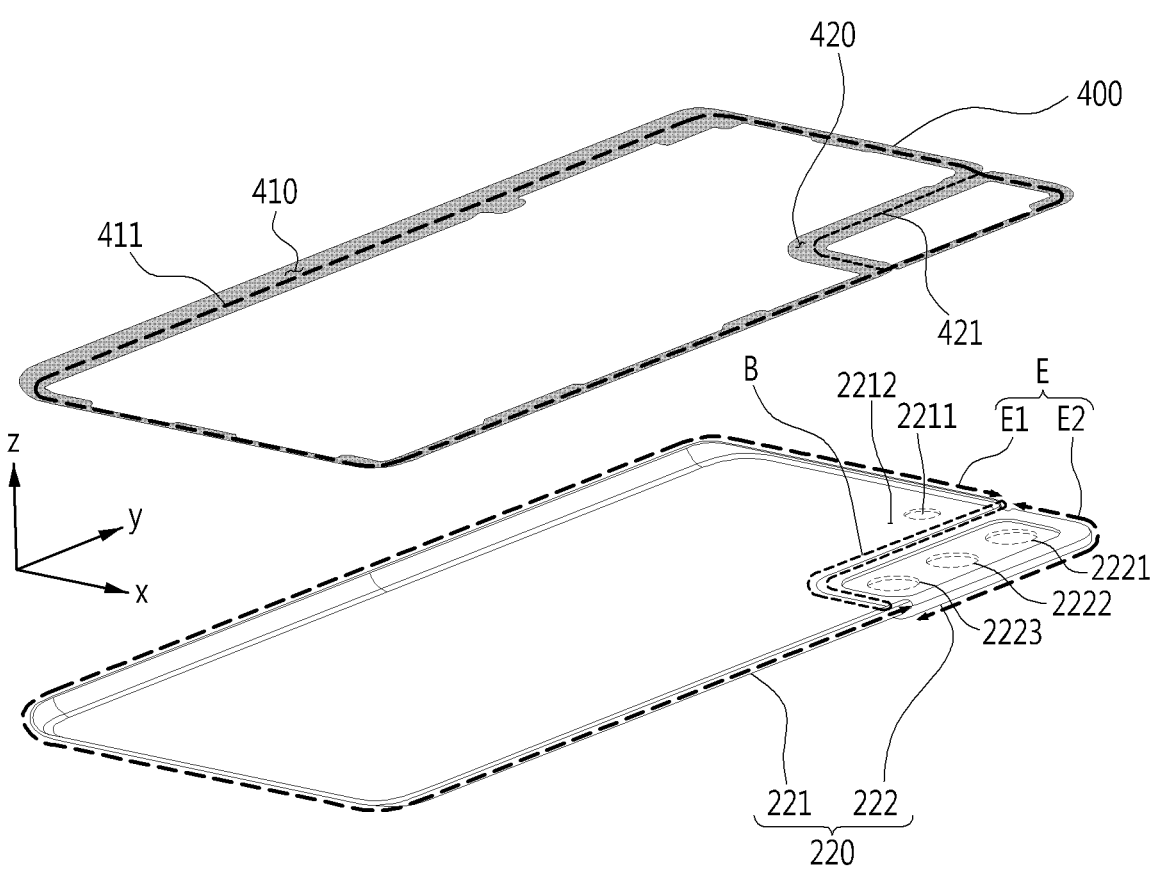
FIG. 5 illustrates a second housing part and a first adhesive member according to an embodiment.
Figure 6:
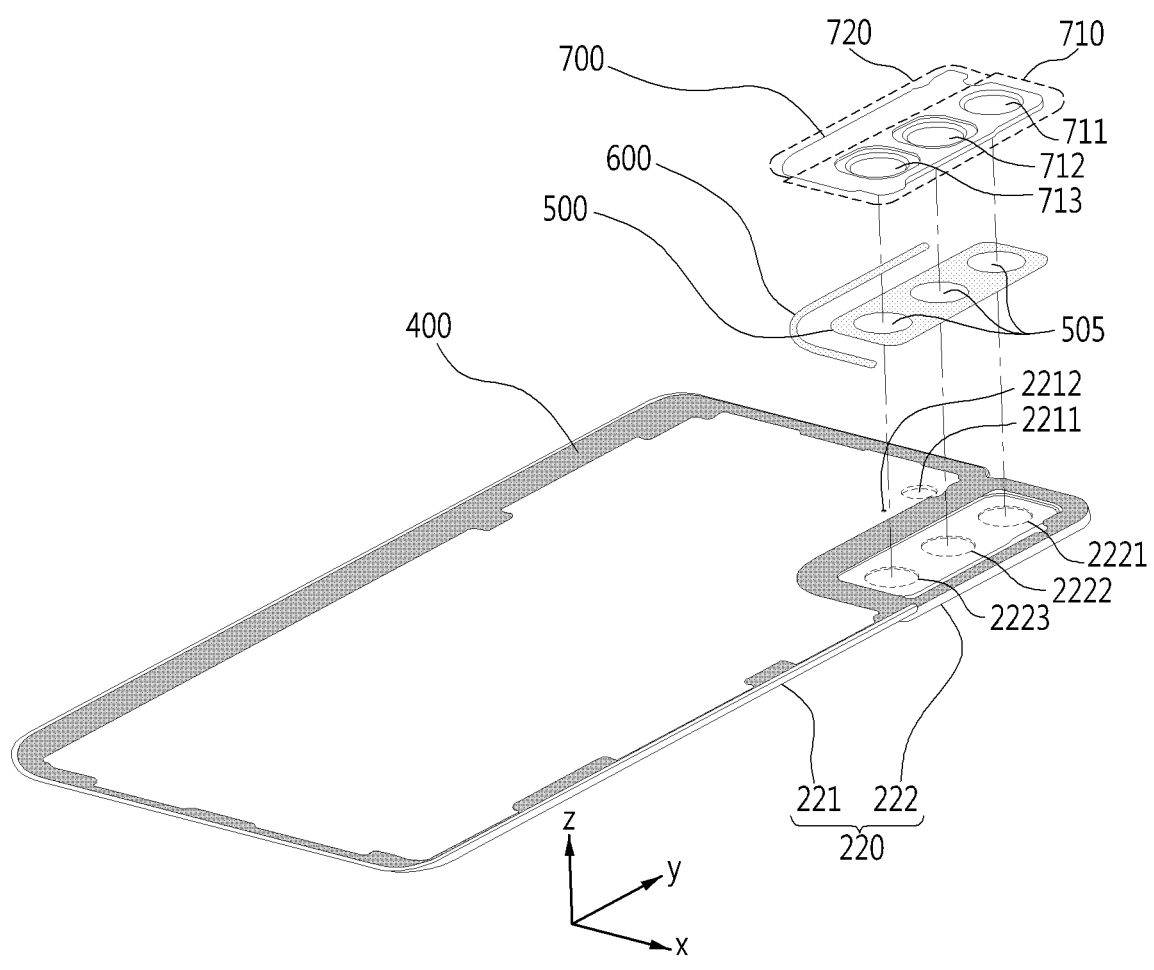
FIG. 6 illustrates the second housing part, the first adhesive member, a second adhesive member, and a housing support member according to an embodiment.
Figure 7:
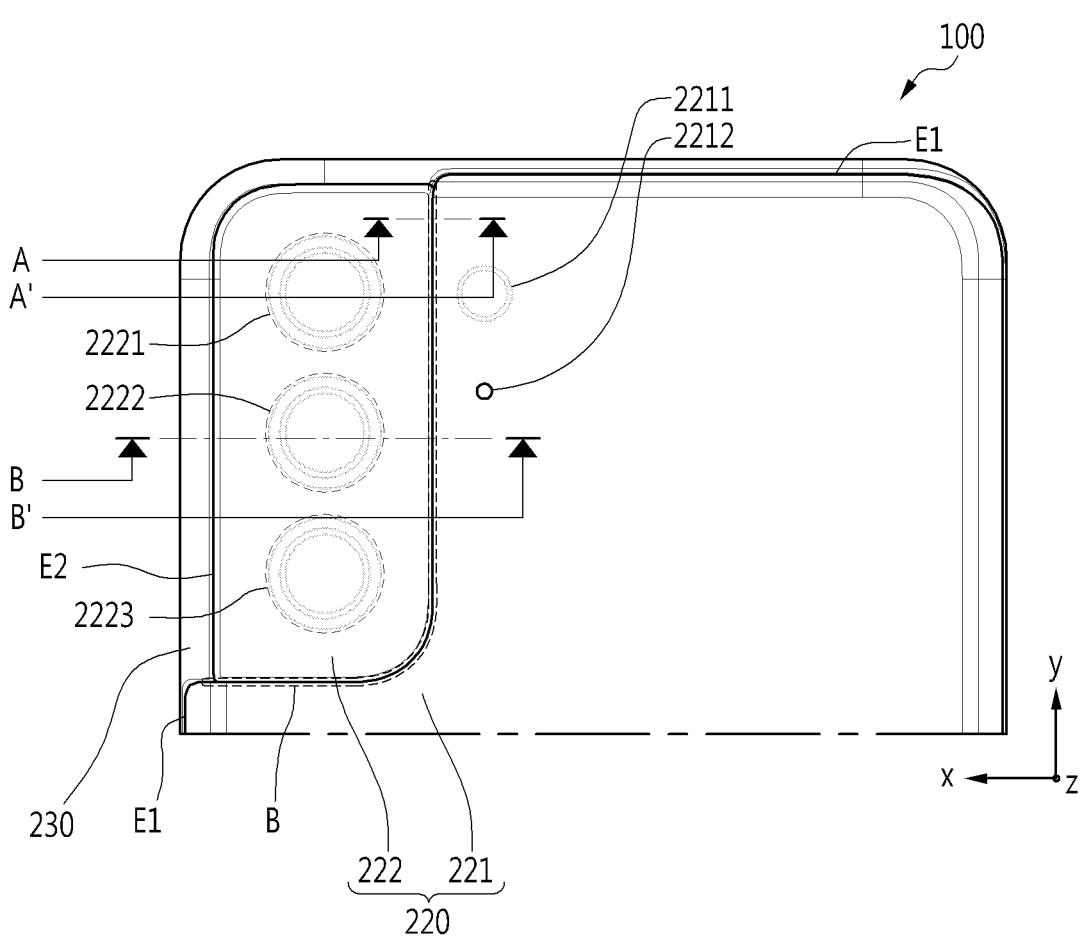
FIG. 7 is a plan view relating to the electronic device of FIG. 1 according to an embodiment.

FIG. 4 is an exploded perspective view relating to the electronic device 100 of FIG. 1 according to an embodiment. FIG. 5 illustrates the second housing part 220 and a first adhesive member 400 according to an embodiment. FIG. 6 illustrates the second housing part 220, a first adhesive member 400, a second adhesive member 500, and a housing support member (or a fourth support member) 700 according to an embodiment. FIG. 7 is a plan view relating to the electronic device 100 of FIG. 1 according to an embodiment.

With reference to FIGS. 4, 5, 6, and 7, in an embodiment, the electronic device 100 may include the second housing part 220, the third housing part 230, the first support member 311, the first substrate assembly 321, the second camera modules 109, 110, and 111, the battery 330, the first adhesive member 400, the second adhesive member 500, the third adhesive member 600, or the housing support member 700. The second housing part 220 may include the first cover member 221 and the second cover member 222. A redundant description relating to some of reference numerals in FIG. 4, 5, 6, or 7 is omitted.

According to an embodiment, the third housing part 230 (e.g., the bezel structure) may include a first bezel part 231, a second bezel part 232, a third bezel part 233, or a fourth bezel part 234. The first bezel part 231 and the second bezel part 232 may be spaced apart from each other and extended in parallel. The third bezel part 233 may connect one end part of the first bezel part 231 and one end part of the second bezel part 232. The fourth bezel part 234 may connect the other end part of the first bezel part 231 and the other end part of the second bezel part 232, and may be spaced apart from the third bezel part 233 and extended in parallel with the third bezel part 233. A first corner part C1 at which the first bezel part 231 and the third bezel part 233 are connected, a second corner part C2 at which the second bezel part 232 and the third bezel part 233 are connected, a third corner part C3 at which the first bezel part 231 and the fourth bezel part 234 are connected, and/or a fourth corner part C4 at which the second bezel part 232 and the fourth bezel part 234 are connected may be rounded. The first bezel part 231 and the second bezel part 232 may have a first length, and the third bezel part 233 and the fourth bezel part 234 may have a second length that is smaller or shorter than the first length. In an embodiment, the first length and the second length may be substantially identical. The first support member 311 may be disposed within the electronic device 100, and may be connected to the third housing part 230 or may be formed integrally with the third housing part 230. The first substrate assembly 321, the battery 330, and/or the second camera modules 109, 110, and 111 may be disposed on or coupled with the first support member 311 between the first support member 311 and the second housing part 220.

According to an embodiment, the first bezel part 231 or a first outer surface of the electronic device 100, which is formed by the first bezel part 231, may have a first height (or a first thickness) H1. The second bezel part 232 may include a first part 232a and a second part 232b. The second bezel part 232 or a second outer surface of the electronic device 100, which is formed by the second bezel part 232, may include the area of a second height H2 by the first part 232a and the area of a third height (or a second thickness) H3 by the second part 232b. The third bezel part 233 may include a third part 233a and a fourth part 233b. The third bezel part 233 or a third outer surface of the electronic device 100, which is formed by the third bezel part 233, may include the area of a fourth height H4 by the third part 233a and the area of a fifth height H5 by the fourth part 233b. The fourth bezel part 234 or a fourth outer surface of the electronic device 100, which is formed by the fourth bezel part 234, may have a sixth height H6.

According to an embodiment, the first height H1 and the fourth height H4 may be the same. The third height H3, the fifth height H5, and the sixth height H6 may be the same. The second height H2 may be smaller or shorter than the third height H3. The fourth height H4 may be smaller or shorter than the fifth height H5.

According to an embodiment, the first height H1 may be smaller or shorter than the fourth height H4 or may be the same as the fourth height H4. The second height H2 may be smaller or shorter than the first height H1 or may be the same as the first height H1.

The first corner part C1 may be formed by the first bezel part 231 and the third part 233a of the third bezel part 233 being connected, for example. If the first height H1 is smaller than the fourth height H4, the first corner part C1 or a first corner-outer surface of the electronic device 100, which is formed by the first corner part C1, may have a form that is gradually or incrementally increased in thickness from the first height H1 to the fourth height H4. If the first height H1 and the fourth height H4 are the same, the first corner part C1 or the first corner-outer surface of the electronic device 100, which is formed by the first corner part C1, may have the first height H1 (or the fourth height 114). The second corner part C2 may be formed by the second part 232b of the second bezel part 232 and the fourth part 233b of the third bezel part 233 being connected, for example. The second corner part C2 or a second corner-outer surface of the electronic device 100, which is formed by the second corner part C2, may have the third height H3 (or the fifth height 115). The third corner part C3 or a third corner-outer surface of the electronic device 100, which is formed by the third corner part C3, may have a form that is gradually or incrementally increased in thickness from the first height H1 to the sixth height H6. The fourth corner part C4 or a fourth corner-outer surface of the electronic device 100, which is formed by the fourth corner part C4, may have a form that is gradually or incrementally increased in thickness from the second height H2 to the sixth height H6.

According to an embodiment, when viewed over the second housing part 220 (e.g., when viewed in the z axis direction), the second camera modules 109, 110, and 111 may be disposed more closely to the second bezel part 232 than the first bezel part 231. When viewed over the second housing part 220, the second camera modules 109, 110, and 111 may be disposed more closely to the third bezel part 233 than the fourth bezel part 234. The second camera modules 109, 110, and 111 may be disposed closely to the second corner part C2, among the first corner part C1, the second corner part C2, the third corner part C3, and the fourth corner part C4, and may be arranged in a direction (e.g., the −y axis direction) from the third bezel part 233 to the fourth bezel part 234. In various embodiments, the number of second camera modules or locations of the second camera modules are not limited to the embodiment of FIG. 4 and may be various.

According to an embodiment, the second cover member 222 of the second housing part 220 may be disposed in accordance with the second camera modules 109, 110, and 111. For example, the second cover member 222 may be disposed in accordance with the second part 232b of the second bezel part 232, the fourth part 233b of the third bezel part 233, and the second corner part C2. The second cover member 222 may include transparent areas 2221, 2222, and 2223, which are respectively aligned with the second camera modules 109, 110, and 111. The second camera modules 109, 110, and 111 may generate an image signal based on external light that is received through the transparent areas 2221, 2222, and 2223. The second cover member 222 may include an opaque first member including openings that have been aligned with the second camera modules 109, 110, and 111 and a transparent second member disposed in the openings of the first member, for example. The transparent areas 2221, 2222, and 2223 of the second cover member 222 may be formed by the openings of the first member, which have been aligned with the second camera modules 109, 110, and 111, and the second member corresponding to the openings.

According to an embodiment, the first cover member 221 of the second housing part 220 may include a transparent area (or an opening) that is disposed in accordance with the flash 112. According to an embodiment, the flash 112 may be disposed in accordance with the second cover member 222. The second cover member 222 may include a transparent area (or an opening) that is disposed in accordance with the flash 112. According to an embodiment, the first cover member 221 may include a microphone hole 2212 that is disposed in accordance with the microphone. According to an embodiment, the microphone hole 2212 may be formed in the second cover member 222.

According to an embodiment, the second housing part 220 may form a part of an outer surface of the electronic device 100. The part of the outer surface may be formed by the first cover member 221 and the second cover member 222. An edge E of the part of the outer surface may include a first edge (an edge along a dotted line that is indicated by reference numeral "E1") and a second edge (an edge along a dotted line that is indicated by reference numeral "E2"). The edge may indicate a part corresponding to the circumference or end of the part of the outer surface, and may be denoted as various other terms, such as an edge or a border. The first edge E1 may be formed by the first cover member 221 of the second housing part 220 in accordance with the first bezel part 231, the first part 232a of the second bezel part 232, the third part 233a of the third bezel part 233, and the fourth bezel part 234, for example. The second edge E2 may be formed by the second cover member 222 of the second housing part 220 in accordance with the second part 232b of the second bezel part 232 and the fourth part 233b of the third bezel part 233, for example. The second housing part 220 may include a boundary part B (refer to FIG. 5 or 7) between the first cover member 221 and the second cover member 222.

According to an embodiment, the first adhesive member 400 may include a first adhesive part 410 and a second adhesive part 420 connected to the first adhesive part 410. The first adhesive part 410 and the second adhesive part 420 may be integrally formed. The first adhesive part 410 may indicate an adhesion area that is extended along a dotted line that is indicated by reference numeral "411", for example. The second adhesive part 420 may indicate an adhesion area that is extended along a dotted line that is indicated by reference numeral "421", for example. The first adhesive part 410 may be extended in a closed loop form along the first edge E1 formed by the second housing part 220. The first adhesive part 410 may be disposed to be adjacent to the first edge E1 between the second housing part 220 and the first support member 311. The second housing part 220 and the first support member 311 may be coupled by the first adhesive part 410. The second adhesive part 420 may be disposed in the second housing part 220 in a way to cover the boundary part B along the boundary part B between the first cover member 221 and the second cover member 222. The whole first adhesive member 400 including the first adhesive part 410 and the second adhesive part 420 may include a heat reaction adhesive member, a light reaction adhesive member, a common adhesive, or a double-sided tape, for example.

According to an embodiment, the first adhesive part 410 may be disposed to be adjacent to a boundary part between the second housing part 220 and the third housing part 230, between the second housing part 220 and the first support member 311. Accordingly, the first adhesive part 410 can prevent an alien substance, such as water or dust, from entering the inside of the electronic device 100 between the second housing part 220 and the third housing part 230. In an embodiment, a junction area having a closed loop form, in which the first adhesive part 410 is disposed, on the first support member 311, may be defined or interpreted as an element that is included in the third housing part 230 not the first support member 311. The second adhesive part 420 can prevent an alien substance, such as water or dust, from entering the inside of the electronic device 100 through the boundary part B between the first cover member 221 and second cover member 222.

According to an embodiment, the housing support member 700 may be coupled with the second housing part 220 within the electronic device 100. The housing support member 700 may include a polymer or metal. The housing support member 700 may include openings 711, 712, and 713 that have been aligned with the second camera modules 109, 110, and 111 or the transparent areas 2221, 2222, and 2223 of the second cover member 222. The housing support member 700 may be coupled with the second housing part 220 by using the second adhesive member 500. According to an embodiment, the second adhesive member 500 may be disposed between the second cover member 222 of the second housing part 220 and the housing support member 700. The second adhesive member 500 may include empty areas (e.g., refer to reference numeral "505") that do not overlap the transparent areas 2221, 2222, and 2223 of the second cover member 222 and the openings 711, 712, and 713 of the housing support member 700. The second adhesive member 500 may include a heat reaction adhesive member, a light reaction adhesive member, a common adhesive, or a double-sided tape, for example.

According to an embodiment, the housing support member 700 may include a first support part 710 and a second support part 720 that is extended from the first support part 710. The first support part 710 may include the openings 711, 712, and 713 corresponding to the second camera modules 109, 110, and 111. The first support part 710 may be coupled with the second cover member 222 of the second housing part 220 by using the second adhesive member 500. When viewed over the second housing part 220 (e.g., when viewed in the z axis direction), the first adhesive member 400 and the second adhesive member 500 may not overlap. The second support part 720 may be extended from the first support part 710 in a way to cover the boundary part B between the first cover member 221 and the second cover member 222 of the second housing part 220. The second support part 720 may be coupled with the second housing part 220 by the second adhesive part 420 of the first adhesive member 400. The third adhesive member 600 may be disposed between the second support part 720 and the first cover member 221. The second support part 720 may be coupled with the first cover member 221 by the third adhesive member 600. When viewed over the second housing part 220, the third adhesive member 600 may not overlap the first adhesive member 400 and the second adhesive member 500. The housing support member 700 coupled with the second housing part 220 by using the second adhesive part 420 of the first adhesive member 400, the second adhesive member 500, and the third adhesive member 600 can contribute to durability relating to coupling (hereinafter coupling durability) between the first cover member 221 and the second cover member 222. The housing support member 700 can prevent the second adhesive part 420 from being damaged or the second adhesive part 420 from being detached from the second housing part 220 due to an external impact or an external load. Accordingly, for example, a waterproof function can be secured. According to various embodiments, additional support structure that is disposed to overlap the housing support member 700 may support the housing support member 700 toward the second housing part 220. The additional support structure may also contribute to coupling durability between the first cover member 221 and the second cover member 222.

In an embodiment, with reference to FIG. 4, the structure in which the second adhesive part 420 is disposed in the second housing part 220 in a way to cover the boundary part B along the boundary part B between the first cover member 221 and the second cover member 222 can contribute to an extension from the first support member 311 in accordance with the boundary part B or the omission of a partition (or a partition structure) (e.g., a rib that separates the spaces in which the second camera modules 109, 110, and 111 are mounted) connected to the first support member 311. Accordingly, space utilization can be improved because various electronic parts or instruments may be mounted on a part that includes an internal space of the electronic device 100 and that corresponds to the boundary part B.

Figure 8:
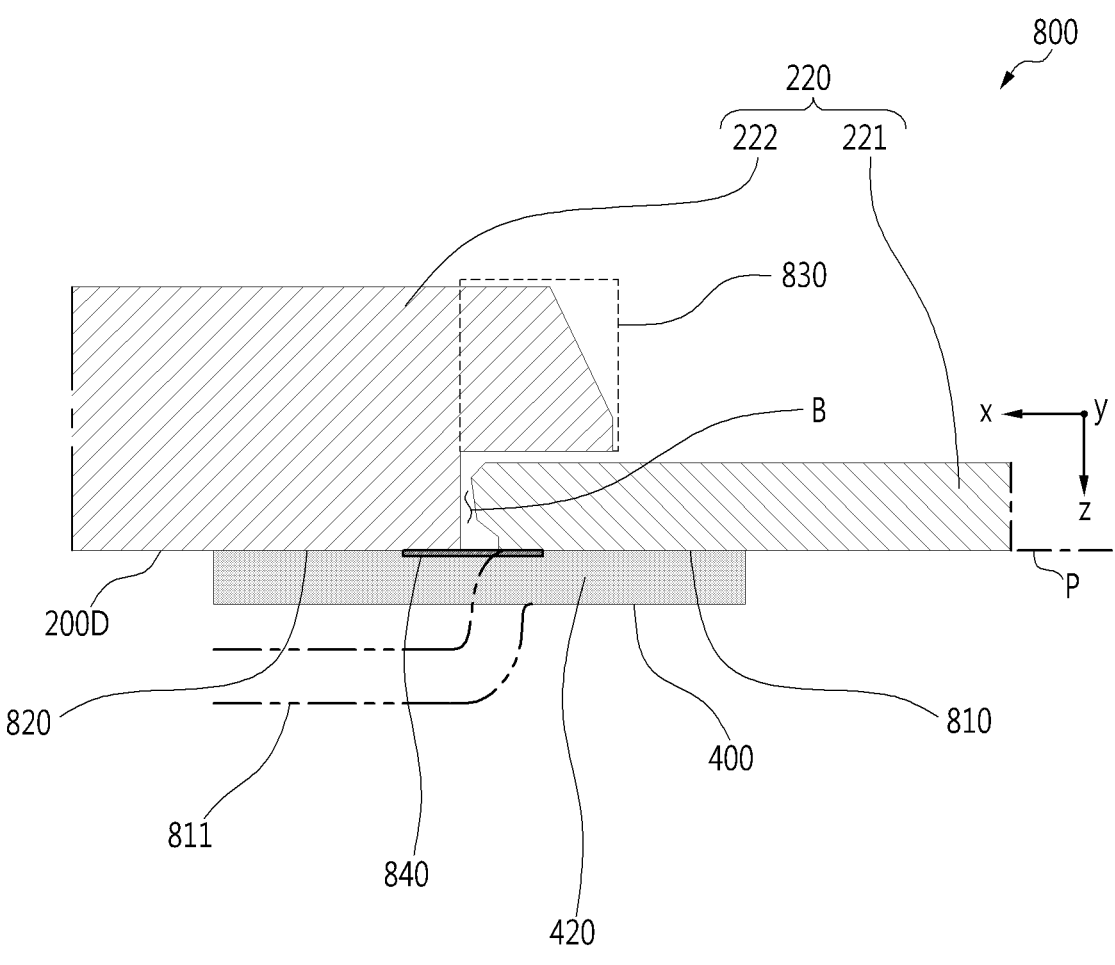
FIG. 8 illustrates a part of a cross-sectional structure for line A-A' in FIG. 7 according to an embodiment.

FIG. 8 illustrates a part 800 of a cross-sectional structure for line A-A' in FIG. 7 according to an embodiment.

With reference to FIG. 8, in an embodiment, the second adhesive part 420 of the first adhesive member 400 may be disposed on one surface of the second housing part 220 by covering the boundary part B between the first cover member 221 and second cover member 222 of the second housing part 220. The first cover member 221 may include a first junction area 810 in which a part of the second adhesive part 420 is disposed. The second cover member 222 may include a second junction area 820 in which a different part of the second adhesive part 420 is disposed. The first junction area 810 and the second junction area 820 may not overlap when viewed over the second housing part 220 (e.g., when viewed in the z axis direction). The first junction area 810 and the second junction area 820 may be included in a third surface 200D of the second housing part 220 that is disposed on a side opposite to the second surface 200B (refer to FIG. 2).

In an embodiment, a height difference between the first junction area 810 and the second junction area 820 may be minimized and implemented. For example, the first junction area 810 and the second junction area 820 may be disposed in parallel substantially on a virtual plane P without the height difference. If the height difference between the first junction area 810 and the second junction area 820 is substantially 0, the second adhesive part 420 may be disposed in the first junction area 810 and the second junction area 820 substantially in a flat form. For example, if the first junction area 810 protrudes with respect to the second junction area 820, the second adhesive part 420 may be disposed in the second housing part 220 in a form, such as reference numeral "811", and may be vulnerable to a detachment phenomenon for an external impact or an external load. In an embodiment, if the height difference between the first junction area 810 and the second junction area 820 is minimized, the detachment phenomenon (or a separation phenomenon) of the second adhesive part 420 for an external impact or an external load can be prevented because coupling durability between the first cover member 221 and the second cover member 222 is secured.

According to an embodiment, the second cover member 222 may include an extension part 830 that covers a part of the first cover member 221. The part of the first cover member 221 may be disposed between the extension part 830 of the second cover member 222 and the second adhesive part 420 of the first adhesive member 400. The extension part 830 can contribute to the aesthetic sensibility of the electronic device 100 by preventing a part of the second adhesive part 420 from being visually exposed to the outside through the boundary part B between the first cover member 221 and the second cover member 222. The boundary part B between the first cover member 221 and the second cover member 222 may have a path which makes it difficult for an alien substance, such as water or dust, to reach the second adhesive part 420 due to the extension part 830.

According to an embodiment, the extension part 830 may be omitted. In this case, the masking member 840 may be disposed between the second adhesive part 420 and the second housing part 220 in accordance with the boundary part B between the first cover member 221 and the second cover member 222. The masking member 840 can prevent the second adhesive part 420 from being visually exposed through the boundary part B. A color of the masking member 840 may be visually exposed through the boundary part B, contributing to the aesthetic sensibility of the electronic device 100. The masking member 840 can prevent an alien substance, such as dust introduced into the boundary part B, from being attached to the second adhesive part 420 because the second adhesive part 420 is not exposed to the outside through the boundary part B. The masking member 840 may include a non-adhesive material to which an alien substance such as dust is not attached. The masking member 840 may include a film or sheet having a thin film form, and may be coupled with the second adhesive part 420 by the adhesiveness of the second adhesive part 420.

Figure 9:
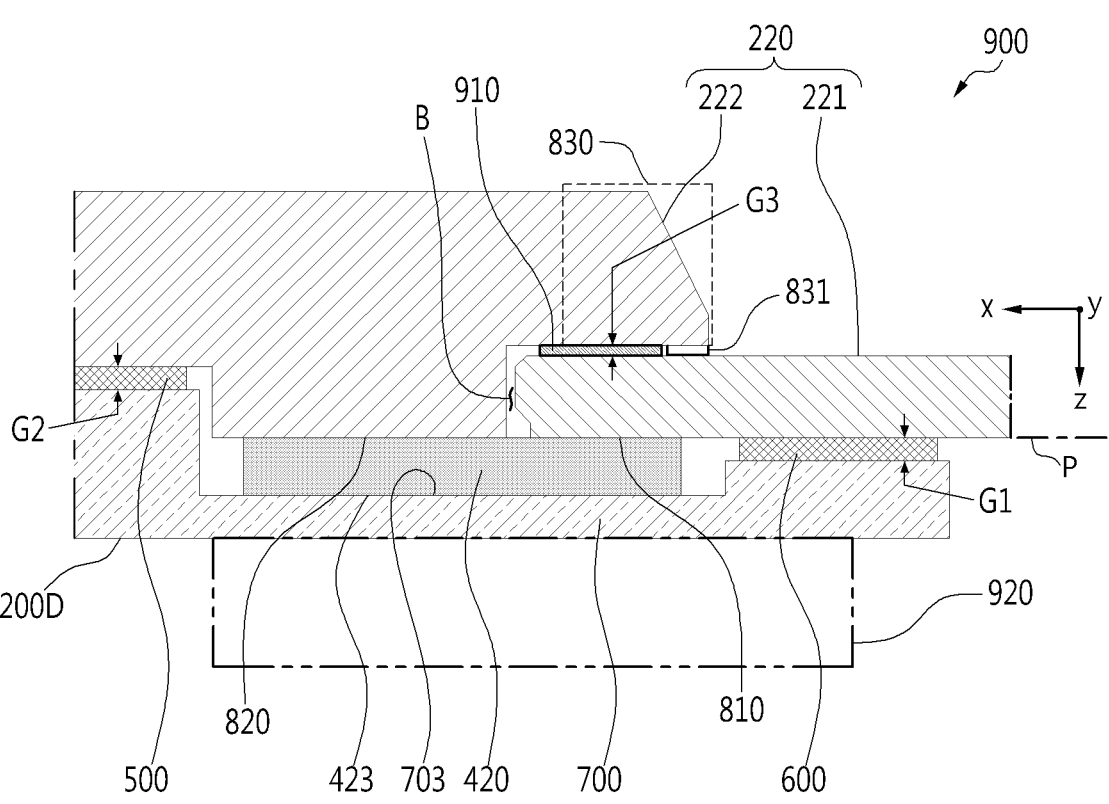
FIG. 9 illustrates a part of a cross-sectional structure for line A-A' in FIG. 7 according to an embodiment.
Figure 10:
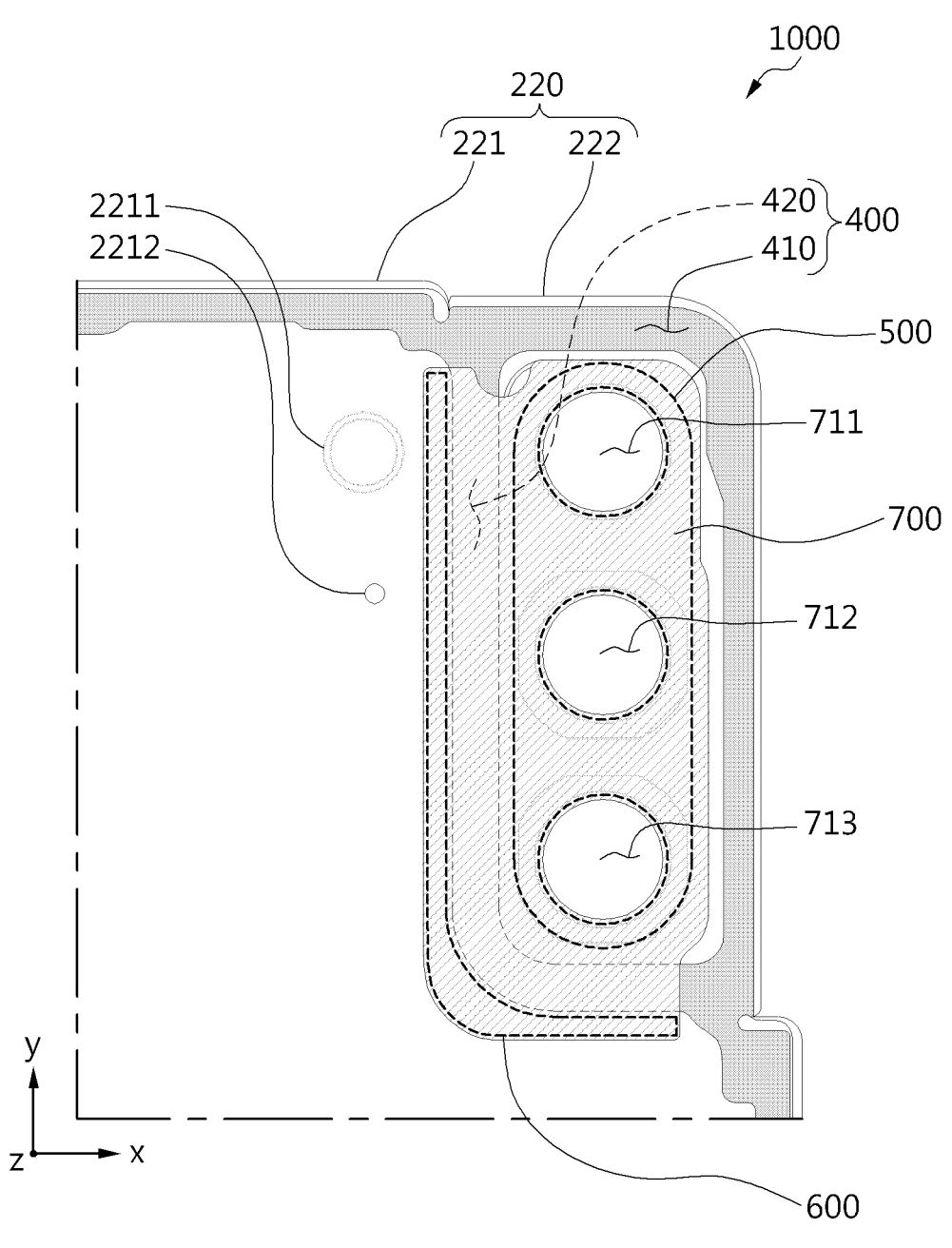
FIG. 10 is a plan view relating to an assembly including the second housing part, the first adhesive member, the second adhesive member, a third adhesive member, and the housing support member in relation to FIG. 9 according to an embodiment.

FIG. 9 illustrates a part 900 of a cross-sectional structure for line A-A' in FIG. 7 according to an embodiment. FIG. 10 is a plan view relating to an assembly 1000 including the second housing part 220, the first adhesive member 400, the second adhesive member 500, the third adhesive member 600, and the housing support member 700 in relation to FIG. 9 according to an embodiment. A redundant description of some of reference numerals in FIG. 9 or 10 is omitted.

With reference to FIGS. 9 and 10, in an embodiment, the first adhesive part 410 of the first adhesive member 400 may be disposed in the second housing part 220 along the edge E (refer to FIG. 4) of the second housing part 220. The second adhesive part 420 of the first adhesive member 400 may be disposed in the second housing part 220 by covering the boundary part B along the boundary part B between the first cover member 221 and the second cover member 222. The first cover member 221 and the second cover member 222 may be coupled with the housing support member 700 by the second adhesive part 420. The second cover member 222 may be coupled with the housing support member 700 by the second adhesive member 500. The first cover member 221 may be coupled with the housing support member 700 by the third adhesive member 600. When viewed over the second housing part 220 (e.g., when viewed in the z axis direction), the second adhesive part 420, the second adhesive member 500, and the third adhesive member 600 may not overlap.

According to an embodiment, the first adhesive part 410 of the first adhesive member 400 may be disposed in an overlapped section between the second housing part 220 and the first support member 311 (refer to FIG. 4) when viewed over the second housing part 220 (e.g., when viewed in the z axis direction), and may couple the second housing part 220 and the first support member 311. Such a coupling method may be denoted as "vertical coupling."

According to an embodiment, the second adhesive part 420 of the first adhesive member 400 may be disposed in the third surface 200D of the second housing part 220 by covering the boundary part B between the first cover member 221 and the second cover member 222, and may couple the first cover member 221 and the second cover member 222. Such a coupling method may be denoted as "parallel coupling."

According to an embodiment, the third adhesive member 600 may be disposed in a first gap G1 between the first cover member 221 and the housing support member 700 (e.g., the second support part 720 in FIG. 6), and can contribute to the first junction area 810 and the second junction area 820 so that the first junction area 810 and the second junction area 820 are disposed in parallel substantially on the virtual plane P without a height difference therebetween. If the first junction area 810 and the second junction area 820 can be disposed in parallel substantially on the virtual plane P without the first gap G1, the third adhesive member 600 may be omitted.

According to various embodiments, the second adhesive member 500 may be disposed in a second gap G2 between the second cover member 222 and the housing support member 700 (e.g., the first support part 710 in FIG. 6), and can contribute to the first junction area 810 and the second junction area 820 so that the first junction area 810 and the second junction area 820 are disposed in parallel substantially on the virtual plane P without a height difference therebetween. If the first junction area 810 and the second junction area 820 can be disposed in parallel substantially on the virtual plane P without the second gap G2, the second adhesive member 500 may be omitted.

According to various embodiments, a fourth adhesive member 910 may be disposed in a third gap G3 between the first cover member 221 and the extension part 830 of the second cover member 222. The fourth adhesive member 910 can contribute to coupling durability between the first cover member 221 and the second cover member 222 in response to an external impact or an external load. The fourth adhesive member 910 can contribute to the first junction area 810 and the second junction area 820 so that the first junction area 810 and the second junction area 820 are disposed in parallel substantially on the virtual plane P without a height difference therebetween, for example. Furthermore, the fourth adhesive member 910 can contribute to a waterproof function. According to various embodiments, the extension part 830 of the second cover member 222 may further include a part that is extended from an area that belongs to the boundary part B and that is adjacent to the outside to the first cover member 221, as indicated by reference numeral "831." This part 831 can prevent the fourth adhesive member 910 from being exposed to the outside. If the first junction area 810 and the second junction area 820 can be disposed in parallel substantially on the virtual plane P without the third gap G3, the fourth adhesive member 910 may be omitted.

According to an embodiment, a support structure 920 may be disposed to at least partially overlap the housing support member 700 when viewed over the second housing part 220 (e.g., when viewed in the z axis direction). The support structure 920 may support the housing support member 700 toward the second housing part 220. The support structure 920 together with the housing support member 700 can contribute to coupling durability between the first cover member 221 and the second cover member 222 in response to an external impact or an external load. The support structure 920 can prevent the second adhesive part 420 from being damaged or from being detached from the second housing part 220 due to an external impact or an external load along with the housing support member 700. The support structure 920 may include the second camera modules 109, 110, and 111 (refer to FIG. 4) and/or a support member related to the second camera modules 109, 110, and 111, a part of the first support member 311 (refer to FIG. 4), and/or a support member that is separately provided, for example.

According to various embodiments (not illustrated), a masking member may be disposed between the second adhesive part 420 of the first adhesive member 400 and the housing support member 700. The masking member can prevent the second adhesive part 420 and the housing support member 700 from being coupled. The masking member may include a film or sheet having a thin film form, and may be coupled with the second adhesive part 420 by the adhesiveness of the second adhesive part 420. The masking member may include a non-adhesive material that is not attached to the housing support member 700. For example, the masking member may be attached to a surface 423 of the second adhesive part 420 that faces the second adhesive part 420, and may not be attached to a surface of the housing support member 700 that faces the housing support member 700. According to various embodiments, the surface 423 of the second adhesive part 420 that faces the housing support member 700 may be formed as a non-adhesion surface by using various methods, such as a laser or printing, without the masking member.

For example, in the embodiment in which the support structure 920 supports the housing support member 700 toward the second housing part 220, the masking member may be disposed between the second adhesive part 420 and the housing support member 700. Although the second adhesive part 420 and the housing support member 700 are not coupled by the masking member, coupling durability of the first cover member 221 and the second cover member 222 can be secured by the support structure 920 that supports the housing support member 700.

Furthermore, for example, in the embodiment in which the support structure 920 has been omitted, the masking member may be disposed between the second adhesive part 420 and the housing support member 700. Although the second adhesive part 420 and the housing support member 700 are not coupled by the masking member, coupling durability between the first cover member 221 and the second cover member 222 can be secured at a critical level or more because the housing support member 700 is coupled with the second cover member 222 by the second adhesive member 500 and coupled with the first cover member 221 by the third adhesive member 600.

Figure 11:
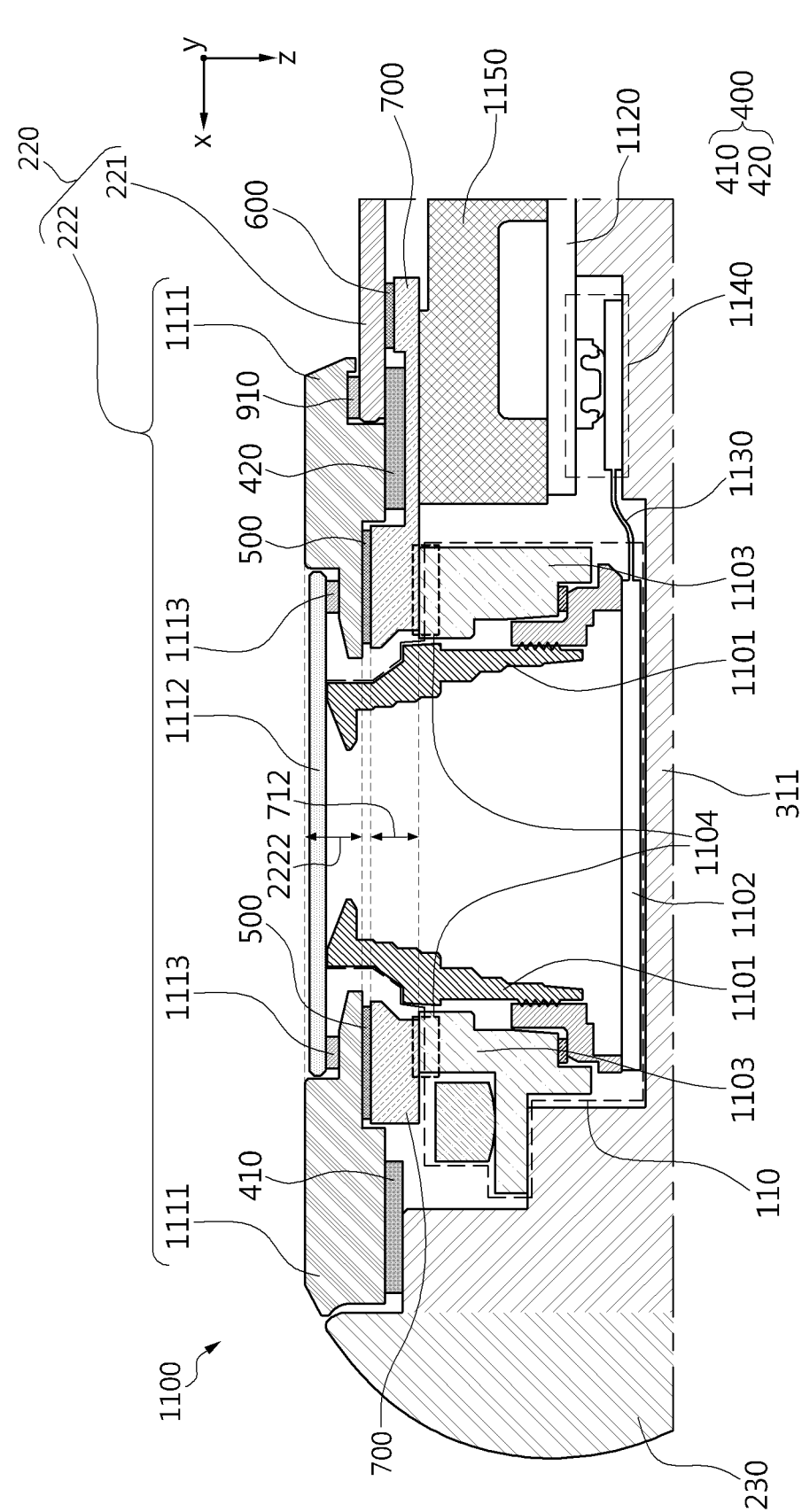
FIG. 11 illustrates a part of a cross-sectional structure for line B-B' in FIG. 7 according to an embodiment.

FIG. 11 illustrates a part 1100 of a cross-sectional structure for line B-B' in FIG. 7 according to an embodiment.

With reference to FIG. 11, in an embodiment, the electronic device 100 (refer to FIG. 2) may include the second housing part 220, the third housing part 230, the first support member 311, the second camera module 110, a PCB 1120, the housing support member 700, the first adhesive member 400, the second adhesive member 500, the third adhesive member 600, the fourth adhesive member 910, or a support structure 1150. The second housing part 220 may include the first cover member 221 and the second cover member 222. The housing support member 700 may be coupled with the second housing part 220 by the second adhesive part 420 of the first adhesive member 400, the second adhesive member 500, and the third adhesive member 600. The second adhesive part 420 may be included in horizontal coupling between the first cover member 221 and the second cover member 222, and can prevent an alien substance, such as water or dust, from entering the inside of the electronic device 100 through the boundary part B between the first cover member 221 and the second cover member 222 (refer to FIG. 7). The second housing part 220 may be coupled with the first support member 311 by the first adhesive part 410 of the first adhesive member 400. The first adhesive part 410 can prevent an alien substance, such as water or dust, from entering the inside of the electronic device 100 between the second housing part 220 and the third housing part 230. A redundant description of some of reference numerals in FIG. 11 is omitted.

According to an embodiment, the second cover member 222 may include an opaque first member 1111 and a transparent second member 1112 (e.g., a camera window) that is disposed in an opening (not illustrated) of the first member 1111. The transparent area 2222 of the second cover member 222 that is formed in accordance with the second camera module 110 may be formed by the opening of the first member 1111 and the second member 1112. The second cover member 222 may include an adhesive member 1113 between the first member 1111 and the second member 1112. The adhesive member 1113 can prevent an alien substance, such as water or dust, from entering the inside of the electronic device 100 between the first member 1111 and the second member 1112. The housing support member 700 may include the opening 712 that overlaps the transparent area 2222 of the second cover member 222.

According to an embodiment, the second camera module 110 may include a barrel structure 1101, a circuit structure 1102 (e.g., a PCB in which an image sensor is disposed) including the image sensor, or a camera support structure 1103. Although not illustrated, the second camera module 110 may include at least one lens (not illustrated) that overlaps the image sensor and that is accommodated in the barrel structure 1101. The barrel structure 1101 may be disposed closely to the second member 1112 of the second cover member 222 through the opening 712 of the housing support member 700. The image sensor may generate an image signal from external light that is received through the second member 1112 (e.g., the camera window). The second camera module 110 may be disposed in the first support member 311 between the second housing part 220 and the first support member 311. The second camera module 110 may be firmly disposed in the first support member 311 by the camera support structure 1103 coupled with the first support member 311.

According to an embodiment, the camera support structure 1103 (e.g., the support structure 920 in FIG. 9) may support the housing support member 700 toward the second housing part 220 (refer to reference numeral "1104"). The camera support structure 1103, together with the housing support member 700, can contribute to coupling durability between the first cover member 221 and the second cover member 222. The camera support structure 1103 may support a structure in which the housing support member 700 and the second cover member 222 are coupled with the second adhesive member 500 interposed therebetween, for example.

According to an embodiment, the PCB 1120 (e.g., the first PCB included in the first substrate assembly 321 in FIG. 3) may be disposed in the first support member 311 between the second housing part 220 and the first support member 311. The PCB 1120 may be electrically connected to the circuit structure 1102 of the second camera module 110 through an electrical path, such as an FPCB 1130 (e.g., a connector connection 1140). When viewed over the second housing part 220 (e.g., when viewed in the z axis direction), the PCB 1120 and the second camera module 110 may not overlap.

According to an embodiment, the electronic device 100 may include the support structure 1150 that is disposed between the housing support member 700 and the PCB 1120. The support structure 1150 may support the housing support member 700 toward the second housing part 220. The support structure 1150 (e.g., the support structure 920 in FIG. 9), together with the housing support member 700, can contribute to coupling durability the first cover member 221 and the second cover member 222. The support structure 1150 may support a structure in which the first cover member 221, the second cover member 222, and the housing support member 700 are coupled with the second adhesive part 420 interposed therebetween, for example. According to various embodiments, the support structure 1150 is not limited to the embodiment of FIG. 11, and may be implemented by being connected to the first support member 311 and extended from the first support member 311.

According to various embodiments of the disclosure, an electronic device (e.g., the electronic device 100 in FIG. 4) may include a cover part (e.g., the second housing part 220 in FIG. 4) that forms an outer surface of the electronic device. The cover part may include a first cover member (e.g., the first cover member 221 in FIG. 4) including a part (e.g., the first edge E1 in FIG. 4) of an edge (e.g., the edge E in FIG. 4) of the outer surface. The cover part may include a second cover member (e.g., the second cover member 222 in FIG. 4) including a second part (e.g., the second edge E2 in FIG. 4) of the edge. The electronic device may include a support member (e.g., the first support member 311 in FIG. 4) disposed within the electronic device. The electronic device may include a first adhesive member (e.g., the first adhesive member 400 in FIG. 4). The first adhesive member may include a first adhesive part (e.g., the first adhesive part 410 in FIG. 4) having a closed loop form, which is disposed between the cover part and the support member along the edge. The first adhesive member may include a second adhesive part (e.g., the second adhesive part 420 in FIG. 4) that is extended from the first adhesive part. The second adhesive part may cover a boundary part (e.g., the boundary part B in FIG. 7) between the first cover member and the second cover member along the boundary part.

According to various embodiments of the disclosure, the electronic device (e.g., the electronic device 100 in FIG. 4) may further include a second support member (e.g., the housing support member 700 in FIG. 4) that is extended from a first cover member (e.g., the first cover member 221 in FIG. 4) to a second cover member (e.g., the second cover member 222 in FIG. 4) and that is coupled with a cover part (e.g., the second housing part 220 in FIG. 4). The second adhesive part (e.g., the second adhesive part 420 in FIG. 4) may be disposed between the second support member and the cover part.

According to various embodiments of the disclosure, the electronic device (e.g., the electronic device 100 in FIG. 4) may further include a second adhesive member (e.g., the second adhesive member 500 in FIG. 4) that is disposed between the second support member (e.g., the housing support member 700 in FIG. 4) and the second cover member (e.g., the second cover member 222 in FIG. 4).

According to various embodiments of the disclosure, the electronic device (e.g., the electronic device 100 in FIG. 4) may further include a third adhesive member (e.g., the third adhesive member 600 in FIG. 4) that is disposed between the second support member (e.g., the housing support member 700 in FIG. 4) and the first cover member (e.g., the first cover member 221 in FIG. 4).

According to various embodiments of the disclosure, when viewed over the outer surface, the first adhesive member (e.g., the first adhesive member 400 in FIG. 4), the second adhesive member (e.g., the second adhesive member 500 in FIG. 4), and the third adhesive member (e.g., the third adhesive member 600 in FIG. 4) may not overlap.

According to various embodiments of the disclosure, the electronic device (e.g., the electronic device 100 in FIG. 4) may further include a camera module (e.g., the second camera module 109, 110, or 111 in FIG. 4) that is disposed between the second support member (e.g., the housing support member 700 in FIG. 4) and the support member (e.g., the first support member 311 in FIG. 4). When viewed over the outer surface, the camera module may overlap a transparent area (e.g., the transparent area 2221, 2222, or 2223 in FIG. 4) included in the second cover member (e.g., the second cover member 222 in FIG. 4) and an opening (e.g., the opening 711, 712, or 713 in FIG. 4) included in the second support member (e.g., the housing support member 700 in FIG. 4).

According to various embodiments of the disclosure, the camera module (e.g., the second camera module 110 in FIG. 11) may include a support structure (e.g., the camera support structure 1103 in FIG. 11) that supports the second support member (e.g., the housing support member 700 in FIG. 11) toward the cover part (e.g., the second housing part 220 in FIG. 11).

According to various embodiments of the disclosure, the electronic device (e.g., the electronic device 100 in FIG. 4) may further include a support structure (e.g., the support structure 920 in FIG. 9 or the support structure 1150 in FIG. 11) that is disposed between the support member (e.g., the first support member 311 in FIG. 11) and the second support member (e.g., the housing support member 700 in FIG. 11). The support structure may support the second support member toward the cover part (e.g., the second housing part 220 in FIG. 9 or 11).

According to various embodiments of the disclosure, the electronic device (e.g., the electronic device 100 in FIG. 4) may further include a non-adhesive material that is disposed between the second adhesive part (e.g., the second adhesive part 420 in FIG. 4) and the second support member (e.g., the housing support member 700 in FIG. 4).

According to various embodiments of the disclosure, a first junction area (e.g., the first junction area 810 in FIG. 8 or 9) of the first cover member (e.g., the first cover member 221 in FIG. 8 or 9) and a second junction area (e.g., the second junction area 820 in FIG. 8 or 9) of the second cover member (e.g., the second cover member 222 in FIG. 8 or 9), in which the second adhesive part (e.g., the second adhesive part 420 in FIG. 8 or 9) is disposed, may be formed to have a same height (i.e., without a height difference).

According to various embodiments of the disclosure, when viewed over the outer surface, the second cover member (e.g., the second cover member 222 in FIG. 8 or 9) may include an extension part (e.g., the extension part 830 in FIG. 8 or 9) that covers a part of the first cover member (e.g., the first cover member 221 in FIG. 8 or 9). The part of the first cover member may be disposed between the extension part and the second adhesive part (e.g., the second adhesive part 420 in FIG. 8 or 9).

According to various embodiments of the disclosure, the electronic device (e.g., the electronic device 100 in FIG. 4) may further include a fourth adhesive member (e.g., the fourth adhesive member 910 in FIG. 9) that is disposed between the extension part (e.g., the extension part 830 in FIG. 9) and the first cover member (e.g., the first cover member 221 in FIG. 9).

According to various embodiments of the disclosure, the electronic device (e.g., the electronic device 100 in FIG. 4) may further include a material (e.g., the masking member 840 in FIG. 8) that is disposed between the cover part (e.g., the second housing part 220 in FIG. 8) and the second adhesive part (e.g., the second adhesive part 420 in FIG. 8). The material may be exposed to the outside through the boundary part (e.g., the boundary part B in FIG. 8).

According to various embodiments of the disclosure, the electronic device (e.g., the electronic device 100 in FIG. 1) may further include a second cover part (e.g., the first housing part 210 in FIG. 1) that forms another surface of the electronic device, which is disposed on a side opposite to the outer surface. The electronic device may further include a bezel structure (e.g., the third housing part 230 in FIG. 1 or 2) that at least partially surrounds a space between the cover part (e.g., the second housing part 220 in FIG. 2) and the second cover part. The bezel structure may be connected to the support member (e.g., the first support member 311 in FIG. 4). The electronic device may further include a display (e.g., the display 101 in FIG. 1 or 3) that is disposed between the support member and the second cover part. The display may be visually exposed through the second cover part.

According to various embodiments of the disclosure, the bezel structure (e.g., the third housing part 230 in FIG. 4) may include a first bezel part (e.g., the second bezel part 232 in FIG. 4) and a second bezel part (e.g., the third bezel part 233 in FIG. 4) that are orthogonal to each other. The first bezel part may include a first part (e.g., the first part 232*a* in FIG. 4) having a first height and a second part (e.g., the second part 232*b* in FIG. 4) having a second height greater than the first height. The second bezel part may include a third part (e.g., the third part 233*a* in FIG. 4) having the first height and a fourth part (e.g., the fourth part 233*b* in FIG. 4) having the second height. The second cover member (e.g., the second cover member 222 in FIG. 4) may be disposed in accordance with the second part, the fourth part, and a corner part (e.g., the second corner part C2 in FIG. 4) to which the second part and the fourth part are connected.

According to various embodiments of the disclosure, the electronic device (e.g., the electronic device 100 in FIG. 1 or 2) may include a housing (e.g., the housing 200 in FIG. 1 or 2). The housing may include a first housing part (e.g., the first housing part 210) that forms a first outer surface of the electronic device. The housing may include a second housing part (e.g., the second housing part 220 in FIG. 2) that forms a second outer surface of the electronic device on a side opposite to the first outer surface. The housing may include a third housing part (e.g., the third housing part 230 in FIG. 1 or 3) that at least partially surrounds a space between the first housing part and the second housing part. The electronic device may include a support member (e.g., the first support member 311 in FIG. 4) that is disposed between the first housing part and the second housing part. The support member may be connected to the third housing part. The electronic device may include a display (e.g., the display 101 in FIG. 1 or 3) that is disposed between the first housing part and the support member. The display may be visually exposed or viewed through the first housing part. The second housing part may include a first cover member (e.g., the first cover member 221 in FIG. 4) including a part (e.g., the first edge E1 in FIG. 4) of an edge (e.g., the edge E in FIG. 4) of the second outer surface. The second housing part may include a second cover member (e.g., the second cover member 222 in FIG. 4) including a second part (e.g., the second edge E2 in FIG. 4) of the edge. The electronic device may include a first adhesive member (e.g., the first adhesive member 400 in FIG. 4). The first adhesive member may include a first adhesive part (e.g., the first adhesive part 410 in FIG. 4) having a closed loop form, which is disposed between the second housing part and the support member along the edge. The first adhesive member may include a second adhesive part (e.g., the second adhesive part 420 in FIG. 4) that is extended from the first adhesive part. The second adhesive part may cover a boundary part (e.g., the boundary part B in FIG. 7) between the first cover member and the second cover member along the boundary part.

According to various embodiments of the disclosure, the electronic device (e.g., the electronic device 100 in FIG. 4) may further include a second support member (e.g., the housing support member 700 in FIG. 4) that is disposed between the second housing part (e.g., the second housing part 220 in FIG. 4) and the support member (e.g., the first support member 311 in FIG. 4). The second support member may be coupled with the second housing part with the second adhesive part (e.g., the second adhesive part 420 in FIG. 4) interposed therebetween.

According to various embodiments of the disclosure, the electronic device (e.g., the electronic device 100 in FIG. 4) may further include a second adhesive member (e.g., the second adhesive member 500 in FIG. 4) that is disposed between the second support member (e.g., the housing support member 700 in FIG. 4) and the second cover member (e.g., the second cover member 222 in FIG. 4). The electronic device may further include a third adhesive member (e.g., the third adhesive member 600 in FIG. 4) that is disposed between the second support member and the first cover member (e.g., the first cover member 221 in FIG. 4).

According to various embodiments of the disclosure, the electronic device (e.g., the electronic device 100 in FIG. 4) may include a camera module (e.g., the second camera module 109, 110, or 111 in FIG. 4) that is disposed between the second support member (e.g., the housing support member 700 in FIG. 4) and the support member (e.g., the first support member 311 in FIG. 4). When viewed over the outer surface, the camera module may overlap a transparent area (e.g., the transparent area 2221, 2222, or 2223 in FIG. 4) that is included in the second cover member (e.g., the second cover member 222 in FIG. 4) and an opening (e.g., the opening 711, 712, or 713 in FIG. 4) that is included in the second support member (e.g., the housing support member 700 in FIG. 4).

According to various embodiments of the disclosure, the third housing part (e.g., the third housing part 230 in FIG. 4) may include a first bezel part (e.g., the second bezel part 232 in FIG. 4) and a second bezel part (e.g., the third bezel part 233 in FIG. 4) that are orthogonal to each other. The first bezel part may include a first part (e.g., the first part 232*a* in FIG. 4) having a first height and a second part (e.g., the second part 232*b* in FIG. 4) having a second height greater than the first height. The second bezel part may include a third part (e.g., the third part 233*a* in FIG. 4) having the first height and a fourth part (e.g., the fourth part 233*b* in FIG. 4) having the second height. The second cover member (e.g., the second cover member 222 in FIG. 4) may be disposed in accordance with the second part, the fourth part, and a corner part (e.g., the second corner part C2 in FIG. 4) to which the second part and the fourth part are connected.

Embodiments of the disclosure disclosed in this specification and the drawings have merely presented specific examples in order to easily describe technical contents according to the embodiments of the disclosure and to help understanding of the embodiments of the disclosure, but are not intended to limit the scope of the embodiments of the disclosure. Accordingly, a change or a modified form should be construed as being included in the scope of various embodiments of the disclosure in addition to the embodiments disclosed herein.

The invention claimed is:

1. An electronic device comprising:
a cover part forming an outer surface and comprising:
    a first cover member comprising a part of an edge of the outer surface; and
    a second cover member comprising a second part of the edge of the outer surface;
a support member disposed within the electronic device; and
a first adhesive member comprising:
    a first adhesive part having a closed loop form and being disposed between the cover part and the support member along the edge; and
    a second adhesive part extended from the first adhesive part and covering a boundary part between the first cover member and the second cover member along the boundary part,
    wherein the second cover member comprises an extension part covering a part of the first cover member when viewed over the outer surface,
    wherein the part of the first cover member is disposed between the extension part and the second adhesive part; and
    a fourth adhesive member disposed in a gap between the extension part and the first cover member.

2. The electronic device of claim 1, further comprising a second support member extended from the first cover member to the second cover member and coupled with the cover part,
    wherein the second adhesive part is disposed between the second support member and the cover part.

3. The electronic device of claim 2, further comprising a second adhesive member disposed between the second support member and the second cover member.

4. The electronic device of claim 3, further comprising a third adhesive member disposed between the second support member and the first cover member.

5. The electronic device of claim 4, wherein the first adhesive member, the second adhesive member, and the third adhesive member do not overlap.

6. The electronic device of claim 2, further comprising a camera module disposed between the second support member and the support member,
    wherein the camera module overlaps a transparent area included in the second cover member and an opening included in the second support member.

7. The electronic device of claim 6, wherein the camera module comprises a support structure supporting the second support member toward the cover part.

8. The electronic device of claim 2, further comprising a support structure disposed between the support member and the second support member and supporting the second support member toward the cover part.

9. The electronic device of claim 2, further comprising a non-adhesive material disposed between the second adhesive part and the second support member.

10. The electronic device of claim 1, wherein a first junction area of the first cover member and a second junction area of the second cover member in which the second adhesive part is disposed have a same height.

11. The electronic device of claim 1, further comprising a material disposed between the cover part and the second adhesive part and exposed to an outside through the boundary part.

12. The electronic device of claim 1, further comprising:
a second cover part forming a second surface of the electronic device disposed on a side opposite to the outer surface;
a bezel structure at least partially surrounding a space between the cover part and the second cover part and connected to the support member; and
a display disposed between the support member and the second cover part and visually exposed through the second cover part.

13. The electronic device of claim 12, wherein:
the bezel structure comprises a first bezel part and a second bezel part orthogonal to each other,
the first bezel part comprises a first part having a first height and a second part having a second height greater than the first height,
the second bezel part comprises a third part having the first height and a fourth part having the second height, and
the second cover member is disposed in accordance with the second part, the fourth part, and a corner part to which the second part and the fourth part are connected.

14. An electronic device comprising:
a housing comprising:
a first housing part forming a first outer of the electronic device;
a second housing part forming a second outer surface of the electronic device on a side opposite to the first outer surface, the second housing part comprising:
a first cover member comprising a part of an edge of the second outer surface, and
a second cover member comprising a second part of the edge of the second outer surface;
a third housing part at least partially surrounding a space between the first housing part and the second housing part;
a support member disposed between the first housing part and the second housing part, and connected to the third housing part;
a display disposed between the first housing part and the support member, and visually viewed through the first housing part; and
a first adhesive member comprising:
a first adhesive part having a closed loop form and being disposed between the second housing part and the support member along the edge, and
a second adhesive part extended from the first adhesive part and covering a boundary part between the first cover member and the second cover member along the boundary part,
    wherein the second cover member comprises an extension part covering a part of the first cover member when viewed over the outer surface,
    wherein the part of the first cover member is disposed between the extension part and the second adhesive part; and a fourth adhesive member disposed in a gap between the extension part and the first cover member.

15. The electronic device of claim 14, further comprising a second support member extended from the first cover member to the second cover member and coupled with the second housing part, wherein the second adhesive part is disposed between the second support member and the second housing part.

16. The electronic device of claim 15, further comprising:

a second adhesive member disposed between the second support member and the second cover member; and a third adhesive member disposed between the second support member and the first cover member.

17. The electronic device of claim 15, further comprising a camera module disposed between the second support member and the support member, wherein the camera module overlaps a transparent area included in the second cover member and an opening included in the second support member.

18. The electronic device of claim 14, wherein:

the third housing part comprises a first bezel part and a second bezel part orthogonal to each other, the first bezel part comprises a first part having a first height and a second part having a second height greater than the first height, the second bezel part comprises a third part having the first height and a fourth part having the second height, and the second cover member is disposed in accordance with the second part, the fourth part, and a corner part to which the second part and the fourth part are connected.

* * * * *